(12) United States Patent
Nakashima et al.

(10) Patent No.: US 7,566,902 B2
(45) Date of Patent: Jul. 28, 2009

(54) LIGHT-EMITTING DEVICE AND ELECTRONIC DEVICE

(75) Inventors: Harue Nakashima, Kanagawa (JP); Satoshi Seo, Kanagawa (JP); Yukie Nemoto, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 757 days.

(21) Appl. No.: 10/839,340

(22) Filed: May 6, 2004

(65) Prior Publication Data

US 2004/0227159 A1 Nov. 18, 2004

(30) Foreign Application Priority Data

May 16, 2003 (JP) ............... 2003-139610

(51) Int. Cl.
*H01L 31/00* (2006.01)
(52) U.S. Cl. ............... 257/59; 257/83; 257/202; 257/E33.064
(58) Field of Classification Search ............... 257/212, 257/40, 643, E39.003, 59, 72, 83, E33.064, 257/E27.131
See application file for complete search history.

(56) References Cited

U.S. PATENT DOCUMENTS

| | | | |
|---|---|---|---|
| 5,493,129 A | 2/1996 | Matsuzaki et al. |
| 5,652,067 A | 7/1997 | Ito et al. |
| 5,680,488 A | 10/1997 | Shimooku |
| 5,703,436 A | 12/1997 | Forrest et al. |
| 5,780,174 A | 7/1998 | Tokito et al. |
| 6,284,393 B1 | 9/2001 | Kosokawa et al. |
| 6,304,309 B1 | 10/2001 | Yamanaka et al. |

(Continued)

FOREIGN PATENT DOCUMENTS

EP         0 845 924        6/1998

(Continued)

OTHER PUBLICATIONS

Japan 06-013184—English Abstract: Dialog(R) File 352: Derwent WPI (2004); Accession No. 009780435.

(Continued)

*Primary Examiner*—Thinh T Nguyen
(74) *Attorney, Agent, or Firm*—Fish & Richardson P.C.

(57) ABSTRACT

The present invention provides a light-emitting device that can independently display images of both front and back sides, in a light emitting device that can display in the both sides and also provides a light-emitting device in which the aperture ratio of both or either of front and back displays increases. A light-emitting device has a structure in which a first light-emitting element and a second light-emitting element that are adjacent to each other are arranged in matrix; wherein the first light-emitting element can emit light to a first side of a substrate and the second light-emitting element can emit light to a second side that is opposite to the first side of the substrate. And light-emission of the first light-emitting element to the second side is shielded and light-emission of the second light-emitting element to the first side is shielded. In each light-emitting element, since a side opposite to a light-emitting side has a film having a light shielding effect, light-emission can be performed separately in each side.

13 Claims, 11 Drawing Sheets

U.S. PATENT DOCUMENTS

| | | |
|---|---|---|
| 6,333,065 B1 | 12/2001 | Arai et al. |
| 6,424,093 B1 | 7/2002 | Mir et al. |
| 6,466,292 B1 | 10/2002 | Kim |
| 6,498,721 B1 * | 12/2002 | Kim .......................... 361/681 |
| 6,653,698 B2 | 11/2003 | Lee et al. |
| 6,819,309 B1 | 11/2004 | Kishi |
| 7,012,364 B2 | 3/2006 | Mori et al. |
| 2001/0055384 A1 | 12/2001 | Yamazaki et al. |
| 2002/0064684 A1 | 5/2002 | Seo |
| 2002/0097194 A1 | 7/2002 | Uchida et al. |
| 2002/0167270 A1 | 11/2002 | Siwinski et al. |
| 2002/0191135 A1 | 12/2002 | Kim |
| 2003/0169250 A1 | 9/2003 | Kimura |
| 2003/0230972 A1 | 12/2003 | Cok et al. |
| 2004/0113545 A1 | 6/2004 | Pang et al. |
| 2004/0239658 A1 | 12/2004 | Koyama et al. |
| 2004/0245529 A1 | 12/2004 | Yamazaki et al. |
| 2004/0245531 A1 | 12/2004 | Fuii et al. |
| 2004/0263056 A1 | 12/2004 | Seo et al. |
| 2004/0263425 A1 | 12/2004 | Anzai et al. |
| 2005/0040753 A1 | 2/2005 | Osame et al. |
| 2005/0151830 A1 | 7/2005 | Yamazaki |

FOREIGN PATENT DOCUMENTS

| | | |
|---|---|---|
| EP | 1 063 630 | 12/2000 |
| EP | 1 103 946 | 5/2001 |
| EP | 1 119 222 | 7/2001 |
| EP | 1 130 565 | 9/2001 |
| EP | 1 227 390 | 7/2002 |
| EP | 1 333 422 | 8/2003 |
| JP | 06-013184 | 1/1994 |
| JP | 06-096858 | 4/1994 |
| JP | 07-220871 | 8/1995 |
| JP | 08-152619 | 6/1996 |
| JP | 09-180883 | 7/1997 |
| JP | 10-162959 | 6/1998 |
| JP | 10-255976 | 9/1998 |
| JP | 11-045779 | 2/1999 |
| JP | 2001-005426 | 1/2001 |
| JP | 2001-312228 | 11/2001 |
| JP | 2001-319776 | 11/2001 |
| JP | 2001-332392 | 11/2001 |
| JP | 2001-343933 | 12/2001 |
| JP | 2001-356714 | 12/2001 |
| JP | 2002-514320 | 5/2002 |
| JP | 2002-517806 | 6/2002 |
| JP | 2002-296063 | 10/2002 |
| JP | 3408154 | 3/2003 |
| JP | 2003-108069 | 4/2003 |
| JP | 2003-317959 | 11/2003 |
| JP | 2003-345271 | 12/2003 |
| WO | WO98/48403 | 10/1998 |
| WO | WO99/65011 | 12/1999 |
| WO | WO01/06484 | 1/2001 |
| WO | WO02/39420 | 5/2002 |
| WO | WO03/038794 | 5/2003 |
| WO | WO03/038797 | 5/2003 |

OTHER PUBLICATIONS

Japan 06-096858—English Abstract: Dialog(R) File 352: Derwent WPI (2004); Accession No. 009874434 and family to U.S. Patent No. 5,652,067 (Desig. ID "AN").

Japan 07-220871—English Abstract: Dialog(R) File 347: JAPIO (2002): Accession No. 04928271.

Japan 08-152619—English Abstract: Dialog(R) File 347: JAPIO (2004): Accession No. 05197119.

Japan 09-180883—English Abstract: Dialog(R) File 352: Derwent WPI (2004); Accession No. 011430507 and family to U.S. Patent No. 5,780,174 (Desig. ID "AQ").

Japan 10-162959—English Abstract: Dialog(R) File 352: Derwent WPI (2004); Accession No. 011872143 and family to U.S. Patent No. 6,284,393 (Desig. ID "AR"); European Patent No. 0 845 924 (Desig. ID "BA"); and European Patent No. 1 119 222 (Desig. ID "BB").

Japan 10-255976—English Abstract: Dialog(R) File 347: JAPIO (2004): Accession No. 05972876.

Japan 11-045779—English Abstract: Dialog(R) File 352: Derwent WPI (2004); Accession No. 012394952 and family to U.S. Patent No. 6,333,065 (Desig. ID "AT").

Japan 2001-312228—English Abstract: Dialog(R) File 347: JAPIO (2004): Accession No. 07084580.

Japan 2001-319776—English Abstract: Dialog(R) File 352: Derwent WPI (2004); Accession No. 014297494.

Japan JP2001-356714—English Abstract: Dialog(R) File 347: JAPIO (2004): Accession No. 07129044.

Japan JP2002-296063—English Abstract: Dialog(R) File 352: Derwent WPI (2004); Accession No. 015054959.

Japan JP2003-317959—English Abstract: Dialog(R) File 347: JAPIO (2004): Accession No. 07823657.

Japan 2003-345271—English Abstract: Dialog(R) File 352: Derwent WPI (2004); Accession No. 015890468.

Kwan Hee Lee et al.; "QCIF Full Color Transparent AMOLED Display"; *2003 SID International Symposium Digest of Technical Papers*, vol. XXXIV, *Book 1*; pp. 104-107; May 2003.

Exhibition of Active Matrix Type Organic EL Display at "13th Flat Panel Display Manufacturing Technology Expo & Conference" by ELDis Group (*in Japanese with full translation*); Jul. 2, 2003.

Documents distributed in the "13th Flat Panel Display Manufacturing Technology Expo & Conference" by ELDis Group (5 pages).

"Two-way display developed"; *The Japan Times*; (1 page); Jul. 3, 2003.

"Mass Production of Organic EL Devices"; *Shimotsuke Newspaper* (*in Japanese with full translation*); Jul. 3, 2003.

* cited by examiner

LIGHT-EMITTING DEVICE AND ELECTRONIC DEVICE

BACKGROUND OF THE INVENTION

1. Field of the Invention

The present invention relates to a light-emitting device in which a pixel portion is formed with a light-emitting element including a light-emitting layer in which an electroluminescence (light-emitting) material is formed between a pair of electrodes. Specifically, the present invention relates to a light-emitting device in which a display can be performed in both front and back sides. Further, the present invention also relates to an electronic device in which both front and back sides thereof are display screens.

2. Description of the Related Art

In recent years, a light-emitting device including a light-emitting element as a self luminous type light-emitting element has been researched and developed actively. The light-emitting device is referred to as an organic EL display or an organic light-emitting diode. Such light-emitting devices have the characteristics of high response speed, low voltage, low electric power consumption driving for displaying a moving image, and therefore, draw attraction as a next generation display such as a new generation of portable phone or personal digital assistant (PDA).

A light-emitting element having an organic compound layer as a light-emitting layer has a structure where a multilayer film is laminated over a substrate. And the multilayer film has a structure in which at least one layer including a light-emitting material is formed between a pair of electrodes, namely an anode and a cathode, one of which is transparent. Electroluminescence is emitted from a light-emitting substance containing layer by applying an electric filed to the anode and the cathode. Also, in this specification, all layers provided between the cathode and the anode is referred to as a light-emitting substance containing layer as a generic term.

In many cases, the light-emitting substance containing layer has a laminate structure typified "a hole transporting layer, a light-emitting layer and an electron transporting layer." Materials for forming the light-emitting substance containing layer are classified broadly into a low-molecular-weight (monomer) material and a high-molecular-weight (polymer) material.

A typical light-emitting element has a laminate structure in which a light-transparent conductive film formed by sputtering over a substrate is used as an anode, a light-emitting substance containing layer and a cathode made of a metal such as aluminum are laminated thereover (hereinafter, a bottom emission type element). In the light-emitting element having this structure, light is transmitted from the anode formed over the substrate. When a display having the light-emitting element with this structure as a pixel is driven in an active matrix driving to display an image, efficiency of light-emitting is extremely reduced since a driving element over the substrate, for instance, a TFT prevents light from passing through the anode.

There is also a light-emitting element having a structure in which a metal electrode that is not light-transparent is formed over a substrate as an anode and a light-emitting substance containing layer and a light-transparent conductive substance are laminated thereover as a cathode (hereinafter, a top emission type element). In this light-emitting element having this structure, light is emitted from the cathode formed over the substrate. Therefore, even when a display is performed in an active matrix driving, light is not shut out by a driving element over the substrate.

Furthermore, a light-emitting element in which light is emitted from both sides of a cathode and an anode, in other words, a structure in which one element for top emission and bottom emission are provided in one pixel (hereinafter, a dual emission type element), is also proposed in Reference 1.

Reference 1: Japanese Patent Laid Open No. 2001-332392

When a light-emitting device having a dual emission type element described in Reference 1 in a pixel portion, however, is driven to display, an image is displayed in one side and a mirror image thereof is displayed in the other side. Accordingly, there is a problem that a character image is inverted in one side.

The dual emission type element has a cathode and an anode that are each light-transparent. Thus, a background view of the anode side is seen on the cathode side, and a background view of the cathode side is seen on the anode side. Accordingly, it is necessary to appropriately provide a material having a light shielding effect for a whole back side of a display screen to be seen for the purpose of precisely acknowledging a displayed image. In this case, the displayed image cannot be seen on the both sides at the same time.

In the dual emission type element of an active matrix driving, there is a problem that a driving element of a bottom emission type element is provided in a portion of a display portion, and thus the aperture ratio in the bottom emission element region is reduced.

SUMMARY OF THE INVENTION

The present invention has been made in view of the above-described problems. It is an object of the present invention to make it possible to independently display images of both a front display and a back display, in a light-emitting device that can display images on the both of the front and back displays. Further, the present invention provides a light-emitting device in which the aperture ratio of both or either of the front and back displays increases.

According to the present invention, a light-emitting device has a structure in which a first light-emitting element and a second light-emitting element that are adjacent to each other are arranged in matrix, the first light-emitting element can emit light in a direction of a first side of a substrate, and the second light-emitting element can emit light in a direction of a second side that is opposite to the first side of the substrate. The light-emission of the first light-emitting element in the direction of the second side is shielded and light-emission of the second light-emitting element in the direction of the first side is shielded. In both light-emitting elements, a film having light shielding effect is formed on the side opposite to the light-emitting side, and thus, each light-emitting side can emit light separately.

In addition to the above-described structure, a light-emitting device has a structure in which the first light-emitting element (the element that emits light to the opposite substrate side) is formed over a semiconductor element for driving each light-emitting element, according to the present invention. By this structure, in the second light-emitting element (the element that emits light to the substrate side), the aperture ratio of both of the front and back displays increases since a region where light is shielded by the semiconductor element for driving the light-emitting element is reduced.

In addition to the above-described structure, a light-emitting device has input units of video signals to each light-emitting element, according to the present invention. As a representative example, a source signal line and a driving element are provided for each light-emitting element. Light emission and non-light emission in each light-emitting element can be controlled by a signal inputted from each source signal line.

A source signal line and a switch functioning exclusively that are common to two light-emitting elements are formed as the input unit of a video signal to each light-emitting element. A signal inputted into one source signal line is inputted into each light-emitting element by the switch functioning exclusively, thereby controlling light emission and non-light emission in each light-emitting element. Also, a control signal that controls independently may be used instead of the switch functioning exclusively.

According to the above-described structures, each display can be performed in each light-emitting element independently by itself, and an arbitrary image can be displayed in each side, in the light-emitting element where light can be emitted in each display screen.

It should be noted that a light-emitting element in this specification includes a light-emitting device or an image display device using a light-emitting element. Additionally, the followings are included in the light-emitting device: a module where a connector, for example, a flexible printed circuit (FPC), a tape automated bonding (TAB) tape, or a tape carrier package (TCP) is set up onto a light-emitting element; a module where a printed wiring board is set to the tip of a TAB tape or a TCP; and a module where integrated circuits (IC) or CPU are directly mounted on a light-emitting element by a chip on glass (COG) manner.

A light-emitting device of the present invention based on the scope of the present invention includes structures described below.

A light-emitting device comprises a first display screen in a first surface of a substrate, and a second display screen in a second surface opposite to the first surface of the substrate, wherein an image of the first display screen is displayed by a first light-emitting element, and an image of the second display screen is displayed by a second light-emitting element, and the image of the first display screen and the image of the second display screen are controlled independently, according to the present invention.

A light-emitting device comprises a pixel portion in which a first light-emitting element and a second light-emitting element that are adjacent to each other and are arranged in matrix; wherein the first light-emitting element can emit light in a direction of a first side of a substrate and the second light-emitting element can emit light in a direction of a second side that is opposite to the first side of the substrate, light-emission of the first light-emitting element in the direction of the second side is shielded and light-emission of the second light-emitting element in the direction of the first side is shielded, according to the present invention.

A light-emitting device has a structure in which a first light-emitting element and a second light-emitting element that are adjacent to each other and are arranged in matrix over a substrate in which a semiconductor element for driving the first light-emitting element and the second light-emitting element is provided; wherein the first light-emitting element has a laminate structure in which a first light-transparent electrode, a light-emitting substance containing layer, and a second light-transparent electrode are sequentially formed from the substrate side; the second light-emitting element has a laminate structure in which a third light-transparent electrode, the light-emitting substance containing layer, and the second light-transparent electrode are sequentially formed from the substrate side; the first light-emitting element is formed over a first light-shielding film and the semiconductor element; and the second light-emitting element is covered with a second light-shielding film, according to the present invention. Also, the first light-transparent electrode and the third light-transparent electrode may comprise the same material.

A light-emitting device has a structure in which a first light-emitting element and a second light-emitting element that are adjacent to each other and are arranged in matrix over a substrate in which a semiconductor element for driving the first light-emitting element and the second light-emitting element is provided; wherein the first light-emitting element has a laminate structure in which a first electrode having light shielding effect, a light-emitting substance containing layer, and a first light-transparent electrode are sequentially formed from the substrate side; the second light-emitting element has a laminate structure in which a second light-transparent electrode, the light-emitting substance containing layer, and the first light-transparent electrode are sequentially formed from the substrate side; the first light-emitting element is formed over the semiconductor element; and the second light-emitting element is covered with a second light shielding film, according to the present invention.

A light-emitting device has a structure in which a first light-emitting element and a second light-emitting element that are adjacent to each other and are arranged in matrix over a substrate in which a semiconductor element for driving the first light-emitting element and the second light-emitting element is provided; wherein the first light-emitting element has a laminate structure in which a first light-transparent electrode, a light-emitting substance containing layer, and a second light-transparent electrode are sequentially formed from the substrate side; the second light-emitting element has a laminate structure in which a third light-transparent electrode, the light-emitting substance containing layer, and a first electrode having light shielding effect are sequentially formed from the substrate side; and the first light-emitting element is formed over a first light shielding film and the semiconductor element, according to the present invention. Also, the first light-transparent electrode and the third light-transparent electrode may comprise the same material.

A light-emitting device has a structure in which a first light-emitting element and a second light-emitting element that are adjacent to each other and are arranged in matrix over a substrate in which a semiconductor element for driving the first light-emitting element and the second light-emitting element is provided; wherein the first light-emitting element has a laminate structure in which a first electrode having light shielding effect, a light-emitting substance containing layer, and a first light-transparent electrode are sequentially formed from the substrate side; the second light-emitting element has a laminate structure in which a second light-transparent electrode, the light-emitting substance containing layer, and a second electrode having light shielding effect are sequentially formed from the substrate side; and the first light-emitting element is formed over the semiconductor element.

A light-emitting device has a structure in which a first light-emitting element and a second light-emitting element that are adjacent to each other and are arranged in matrix over a substrate in which a semiconductor element for driving the first light-emitting element and the second light-emitting element is provided; wherein the first light-emitting element has a laminate structure in which a first electrode having light shielding effect, a first light-emitting substance containing layer, and a first light-transparent electrode are sequentially formed from the substrate side; the second light-emitting element has a laminate structure in which a second light-transparent electrode, a second light-emitting substance containing layer, and a second electrode having light shielding effect are sequentially formed from the substrate side; and the first light-emitting element is formed over the semiconductor element and the second light-emitting element, according to the present invention.

A light-emitting device has a structure in which a first light-emitting element and a second light-emitting element that are adjacent to each other and are arranged in matrix over a substrate in which a semiconductor element for driving the first light-emitting element and the second light-emitting element is provided; wherein the first light-emitting element has a laminate structure in which a first electrode having light shielding effect, a first light-emitting substance containing layer, and a first light-transparent electrode are sequentially formed from the substrate side; the second light-emitting element has a laminate structure in which a second light-transparent electrode, a second light-emitting substance containing layer, and a second electrode having light shielding effect are sequentially formed from the substrate side; and the first light-emitting element is formed over the semiconductor element, according to the present invention. Also, the first light-transparent electrode of the first light-emitting element and the second light-transparent electrode of the second light-emitting element may comprise the same material.

These and other objects, features and advantages of the present invention become more apparent upon reading of the following detailed description along with the accompanying drawings.

DETAILED DESCRIPTION OF THE INVENTION

Figure 1A:
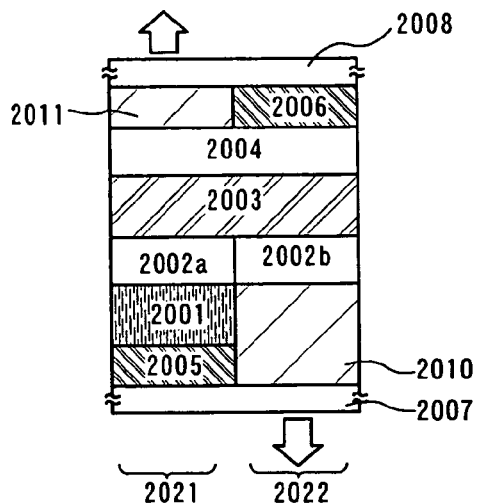
FIGS. 1A to 1F are cross-sectional views of light-emitting devices according to the present invention.

Embodiment modes of the present invention are described below in detail with reference to drawings. Here, a driving element of an active matrix method is described, but a driving method may be a simple matrix method. As a switching element and a driving element, a thin film transistor (TFT) is described, but there is no limitation in particular. For example, a semiconductor element such as a MOS transistor, an organic transistor, or a molecule transistor may be used as well. In addition, in this embodiment mode, a light-emitting region corresponding to one light-emitting element is a pixel.

Embodiment Mode 1

In this embodiment mode, a structure of a light-emitting device of the present invention is described with reference to FIGS. 1A to 1F. FIGS. 1A to 1F are cross sectional views of light-emitting devices in a region where two light-emitting elements that are adjacent to each other are formed. In the light-emitting elements of this embodiment mode, an electrode that is formed on a substrate side is referred to as a first electrode and an electrode that is formed on an opposite substrate side is referred to as a second electrode.

Layers (hereinafter, a layer having a semiconductor element) 2001, 2101, 2201, 2301, 2401 and 2501 are formed over substrates 2007, 2107, 2207, 2307, 2407, and 2507. In the layers, a switching element, a driving element and the like for a top emission type light-emitting element and a bottom emission type light-emitting element are formed.

An element that emits light upwardly above the layers having a semiconductor element 2001, 2101, 2201, 2301, 2401, and 2501 is a top emission type light-emitting element, while a light-emitting element that emits light downward is a bottom emission type light-emitting element. In other words, an element that emits light in the direction of the substrate side is a bottom emission type light-emitting element. And light-emitting regions of the top emission type light-emitting element are denoted by reference numerals 2021, 2121, 2221, 2321, 2421, and 2521, and light-emitting regions of the bottom emission type light-emitting element are denoted by reference numerals 2022, 2122, 2222, 2322, 2422, and 2522. Opposite substrates 2008, 2108, 2208, 2308, 2408, and 2508 are formed over both light-emitting elements, namely, on the side opposite to the substrate.

The respective light-emitting elements include a first electrode, a second electrode, and a light-emitting substance containing layer formed therebetween. Light emission and non-light emission of the respective light-emitting elements is controlled by a switching element, a driving element or the like.

A light shielding film is formed in a lower portion of the top emission type light-emitting element, in other words, the substrate side. An another light shielding film is formed in an upper portion of the bottom emission type light-emitting element, in other words, the opposite substrate side. By this structure, light that is generated in the each light-emitting element is emitted to only one direction, and thus, one direction of light emission can be performed in each light-emitting element. As a result, different images can be displayed in two directions.

Each structure is described in detail hereinafter.

FIG. 1A shows a structure in which a first electrode and a second electrode of the top emission type light-emitting element, and a first electrode and a second electrode of the bottom emission type light-emitting element are formed from light-transparent conductive films, respectively, and light shielding films are provided separately in the respective light-emitting elements.

A first light shielding film 2005 is formed over a substrate 2007 of the top emission type light-emitting element, and a first insulating layer 2010 is formed over the substrate 2007 of the bottom emission type light-emitting element. A layer having the semiconductor element 2001 is formed over the first light shielding film 2005 in a light-emitting region of the top emission type light-emitting element. Also, the first light shielding film 2005 can be formed between the substrate and the layer having a semiconductor element or in the layer having a semiconductor element, and etched into a desired shape. In addition, the first light shielding film can be formed into a desired shape by ink-jetting or the like. In addition, a film like a filter may be provided for a surface of the substrate. It should be noted that an insulating film is preferably formed between the layer having a semiconductor element and the first light shielding film, in the case where the first light shielding film is conductive.

First electrodes 2002a and 2002b of both light-emitting elements are formed over the layer having a semiconductor element 2001 and the first insulating film 2010. A light-emitting substance containing layer 2003 is formed thereover, and a second electrode 2004 is formed thereover. The first electrodes 2002a and 2002b and the second electrode 2004 are formed from light-transparent conductive films.

In the light-emitting region 2022 of the bottom emission type light-emitting element, a second light shielding film 2006 is formed over the second electrode 2004. In a light-emitting region 2021 of the top emission type light-emitting element, a second insulating layer 2011 is formed. The opposite substrate 2008 is formed over the second light shielding film 2006 and the second insulating layer 2011. A film having light shielding effect is formed as the second light shielding film 2006, and etched into a desired shape. Further, the second light shielding film 2006 can be formed into a desired shape by ink-jetting or the like. In addition, a film like a filter may be provided for a surface of the opposite substrate 2008. It should be noted that an insulating film is preferably formed between the second electrode 2004 and the second light shielding film 2006, in the case where the second light shielding film is conductive.

Figure 1B:
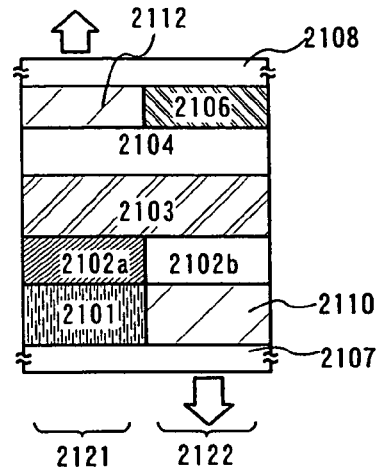

A structure shown in FIG. 1B is described. In FIG. 1B, a first electrode of a top emission type light-emitting element is formed from a conductive film having light shielding effect, and a second electrode of the top emission type light-emitting element, and a first electrode and a second electrode of a bottom emission type light-emitting element are formed from light-transparent conductive films. Also, a structure in which a light shielding film is separately formed on the opposite substrate side of the bottom emission type light-emitting element is shown.

A layer having a semiconductor element 2101 is formed in a light-emitting region 2121 of the top emission type light-emitting element, and a first insulating layer 2110 is formed in a light-emitting region 2122 of the bottom emission type light-emitting element over a substrate 2107.

First electrodes 2102a and 2102b of both light-emitting elements are formed over the layer having a semiconductor element 2101 and the first insulating layer 2110. A light-emitting substance containing layer 2103 is formed thereover, and a second electrode 2104 is formed thereover. The first electrode 2102a of the top emission type light-emitting element is formed from a conductive film having light shielding effect. Typically, the first electrode can be formed from a drain electrode of a driving TFT or a conductive film that is connected thereto. Also, a light-transparent conductive film may be formed over the conductive film having light shielding effect. The first electrode 2102b of the bottom emission type light-emitting element is formed from a light-transparent conductive film. The second electrode 2104 of both light-emitting elements is formed from a light-transparent conductive film. Also, a light-transparent film may be formed over the layer having a semiconductor element 2101 and the first insulating layer 2110, and formed into a shape of each electrode, and thereafter, impurities may be added into the first electrode region of the top emission type light-emitting element to absorb light in a visible region.

In the light-emitting region 2122 of the bottom emission type light-emitting element, a light shielding film 2106 is formed over the second electrode 2104. In the light-emitting region 2121 of the top emission type light-emitting element, a second insulating layer 2112 is formed. The opposite substrate 2108 is formed over the light shielding film 2106 and the second insulating layer 2112. The formation method and the position of the light shielding film 2106 are the same as those of the second light shielding film 2006 in FIG. 1A.

Figure 1C:
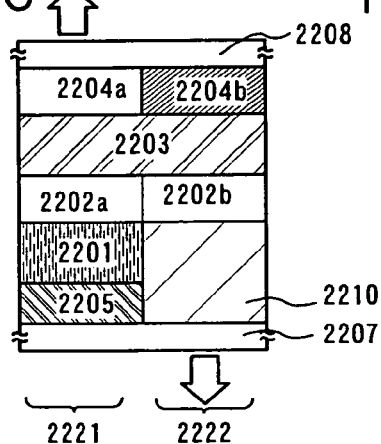

A structure shown in FIG. 1C is described. In FIG. 1C, a first electrode and a second electrode of a top emission type light-emitting element and a first electrode of a bottom emission type light-emitting element are formed from light-transparent conductive films, and a second electrode of the bottom emission type light-emitting element is formed from a conductive film having light shielding effect. A structure in which a light shielding film is separately formed on the substrate side of the top emission type light-emitting element is shown.

A light shielding film 2205 is formed on the substrate 2207 of the top emission type light-emitting element, and a first insulating layer 2210 is formed on the substrate 2207 of the bottom emission type light-emitting element. In the light-emitting region 2221 of the top emission type light-emitting element, a light shielding film 2205 and the layer having a semiconductor element 2201 are formed.

First electrodes 2202a and 2202b of both light-emitting elements are formed over the layer having a semiconductor element 2201 and the first insulating layer 2210. A light-emitting substance containing layer 2203 is formed thereover. A second electrode 2204a is formed thereover in the top emission type light-emitting element, and a second electrode 2204b is formed thereover in the bottom emission type light-emitting element. The first electrodes 2202a and 2202b of both light-emitting elements are formed from a light-transparent conductive film. The second electrode 2204a of the top emission type light-emitting element is formed from a light-transparent conductive film, and the second electrode 2204b of the bottom emission type light-emitting element is formed from a conductive film having light shielding effect. The opposite substrate 2208 is formed over the second electrodes 2204a and 2204b. The formation method and the position of the light shielding film 2205 can be the same as those of the first light shielding film 2005 in FIG. 1A.

Figure 1D:
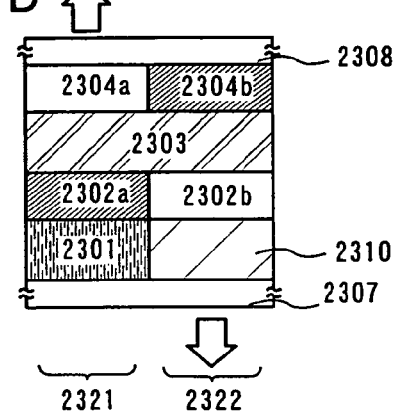

A structure shown in FIG. 1D is described. In FIG. 1D, a first electrode of a top emission type light-emitting element comprises a conductive film having light shielding effect and a second electrode of the top emission type light-emitting element comprises a light-transparent conductive film. A first electrode of a bottom emission type light-emitting element is formed from a light-transparent conductive film, and a second electrode of the bottom emission type light-emitting element is formed from a conductive film having light shielding effect. In this structure, a light shielding film is not required to be provided separately.

The layer having a semiconductor element 2301 is formed in a light-emitting region 2321 of the top emission type light-emitting element, and a first insulating layer 2310 is formed in a light-emitting region 2322 of the bottom emission type light-emitting element over the substrate 2307.

First electrodes 2302a and 2302b of both light-emitting elements are formed over the layer having a semiconductor element 2301 and the first insulating layer 2310. The first electrode 2302a of the top emission type light-emitting element is formed from a conductive film having light shielding effect, representatively, a drain electrode of a driving TFT or a conductive film connected thereto. Also, a light-transparent conductive film may be formed over the conductive film having light shielding effect. The first electrode 2302b of the bottom emission type light-emitting element comprises a light-transparent conductive film. Further, a light-transparent film may be formed over the layer having a semiconductor element 2301 and the first insulating layer 2310, and formed into a shape of each electrode, and thereafter, impurities may be added into the first electrode region 2302a of the top emission type light-emitting element to absorb light in a visible region.

A light-emitting substance containing layer 2303 is formed thereover. Second electrodes 2304a and 2304b are formed over the light-emitting substance containing layer 2303. The second electrode 2304a of the top emission type light-emitting element comprises a light-transparent conductive film. The second electrode 2304b of the bottom emission type light-emitting element is formed from a conductive film having light shielding effect. The opposite substrate 2308 is formed over the second electrodes 2304a and 2304b.

Figure 1E:
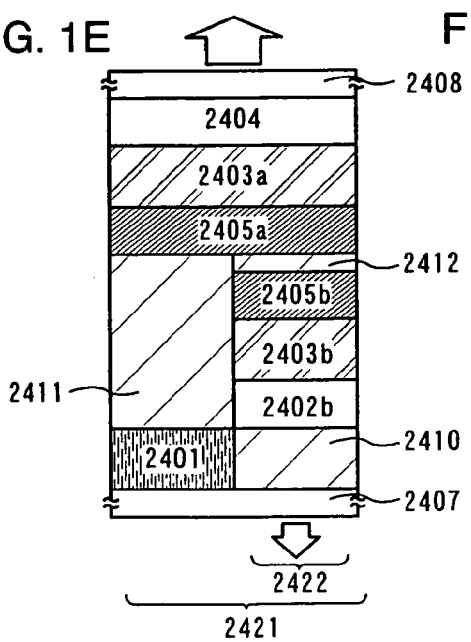

A structure shown in FIG. 1E is described. FIG. 1E is different from FIGS. 1A to 1D in the followings: two different light-emitting substance containing layers are formed, a light-emitting substance containing layer 2403a of a top emission type light-emitting element covers a light-emitting region of a bottom emission type light-emitting element. Further, a first electrode 2405a of the top emission type light-emitting element is formed from a conductive film having light shielding effect, and a second electrode 2404 of the top emission type light-emitting element is formed from a light-transparent conductive film. A first electrode 2402b of the bottom emission type light-emitting element is formed from a light-transparent conductive film, and a second electrode 2405b is formed from a conductive film having light shielding effect. In this structure, a light shielding film is not required to be provided, separately. In addition, in this structure, the top emission type light-emitting element covers the bottom emission type light-emitting element. Thus, the region of the top emission light-emitting element over the bottom emission type light-emitting element can also emit light, thereby increasing the aperture ratio of both of front and back displays.

The layer having a semiconductor element 2401 is formed the a light-emitting region 2421 of the top emission type light-emitting element and a first insulating layer 2410 is formed in the light-emitting region 2422 of the bottom emission type light-emitting element over the substrate 2407.

The first electrode 2402b of the bottom emission type light-emitting element is formed over the first insulating layer 2410. The first electrode 2402b of the bottom emission type light-emitting element is formed from a light-transparent conductive film. A light-emitting substance containing layer 2403b is formed over the first electrode 2402b of the bottom emission type light-emitting element. The second electrode 2405b is formed over the light-emitting substance containing layer 2403b, and a second insulating layer 2412 is formed thereover. On the other hand, a third insulating layer 2411 is formed over the layer having a semiconductor element 2401, and the first electrode 2405a, the second light-emitting substance containing layer 2403a and the second electrode 2404 of the top emission type light-emitting element are formed over the second insulating layer and the third insulating layer. The second electrode 2405b of the bottom emission type light-emitting element and the first electrode 2405a of the top emission type light-emitting element comprise conductive films having light shielding effect and the second electrode 2404 of the top emission type light-emitting element comprises a light-transparent conductive film. Also, the top emission type light-emitting element may be formed without overlapping with the bottom emission type light-emitting element. In this case, the second electrode 2405a of the bottom emission type light-emitting element and the first electrode 2405b of the top emission type light-emitting element can be formed from the same material.

The opposite substrate 2408 is formed over the second electrode 2404 of the top emission type light-emitting element.

Figure 1F:
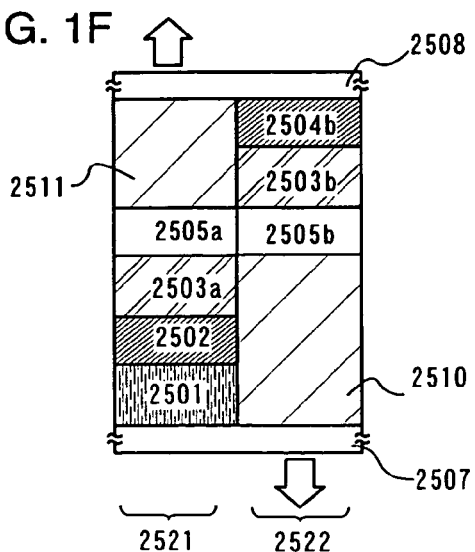

A structure shown in FIG. 1F is described. In FIG. 1F, two different light-emitting substance containing layers are formed as in FIG. 1E. Further, a first electrode of a top emission type light-emitting element is formed from a conductive film having light shielding effect, and a second electrode of the top emission type light-emitting element is formed from a light-transparent conductive film. A first electrode of a bottom emission type light-emitting element is formed from a light-transparent conductive film, and a second electrode thereof is formed from a conductive film having light shielding effect. In this structure, a light shielding film is not required to be provided separately.

In a light-emitting region 2521 of the top emission type light-emitting element over the substrate 2507, a layer having a semiconductor element 2501 is formed, a first electrode 2502 of the top emission type light-emitting element is formed thereover, a first light-emitting substance containing layer 2503a is formed thereover, and a second electrode 2505a is formed thereover. In addition, a first insulating layer 2511 is formed over the second electrode.

In a light-emitting region 2522 of the bottom emission type light-emitting element, a second insulating layer 2510 is formed over the substrate 2507. The first electrode 2505b of the bottom emission type light-emitting element is formed over the second insulating layer 2510, a second light-emitting substance containing layer 2503b is formed thereover, and the second electrode 2504b is formed thereover.

The first electrode of the top emission type light-emitting element and the second electrode of the bottom emission type light-emitting element are formed from a conductive film having light shielding effect. Further, the second electrode of the top emission type light-emitting element and the first electrode of the bottom emission type light-emitting element are formed from a light-transparent conductive film.

The second electrode 2505a of the top emission type light-emitting element and the first electrode 2505b of the bottom emission type light-emitting element comprise a light-transparent conductive film and thus, can be formed from the same material.

The opposite substrate 2508 is provided over the first insulating layer 2511 formed in the top emission type light-emitting element and the second electrode 2504b formed in the bottom emission type light-emitting element.

Embodiment Mode 2

An example of a light-emitting device that can emit light on both of front and back displays is described with reference to FIGS. 2 and 4 according to the present invention. Note that this embodiment mode corresponds to the structure shown in FIG. 1B that has been described in Embodiment Mode 1.

Figure 2:
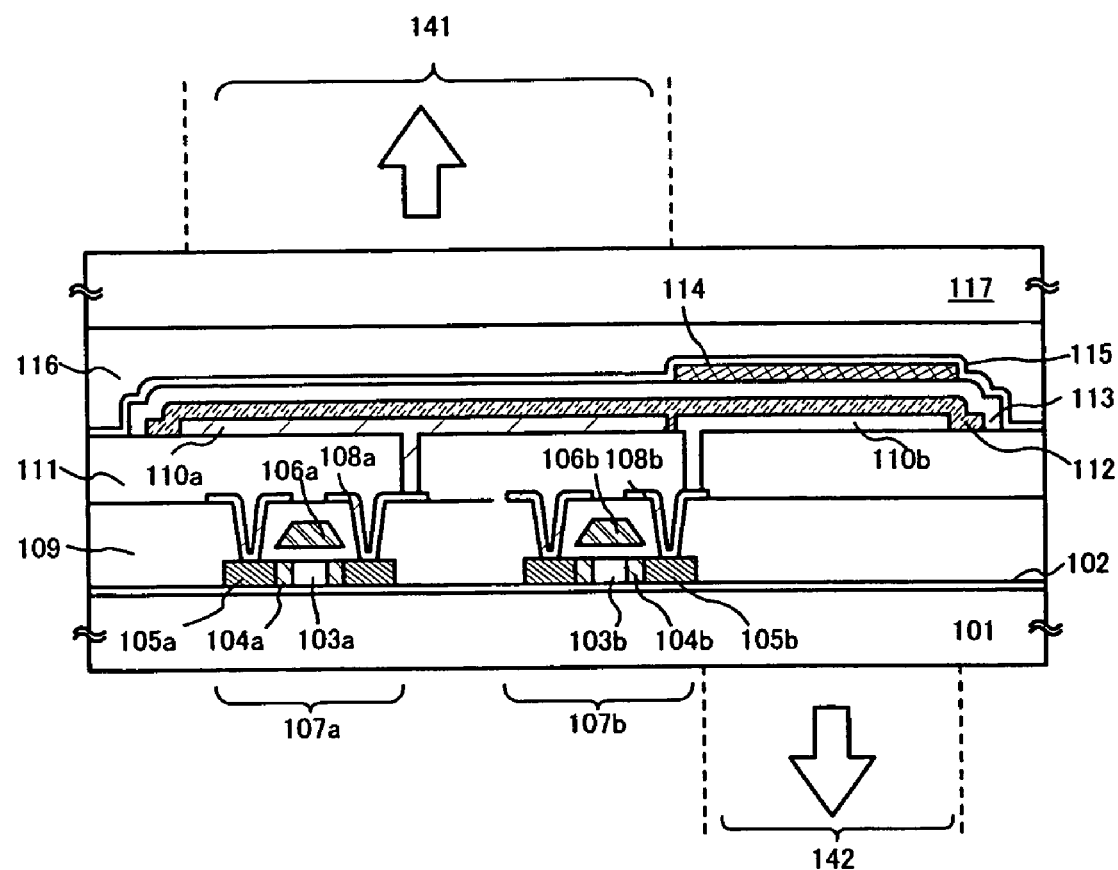
FIG. 2 is a cross-sectional view of a light-emitting device according to the present invention.

FIG. 2 is a cross sectional view of a portion of a pixel portion. In FIG. 2, reference numeral 101 denotes a substrate, reference numerals 102, 109, and 111 denote insulating layers, reference numerals 107a and 107b denote TFTs, reference numerals 110a and 110b denote first electrodes (110a and 110b are a light shielding conductive layer and a transparent conductive layer, respectively), reference numeral 112 denotes a light-emitting substance containing layer, reference numeral 113 denotes a second electrode, reference numeral 114 denotes a light shielding layer, reference numeral 115 denotes a transparent protective layer, reference numeral 116 denotes a sealing agent, reference numeral 117 denotes an opposite substrate, reference numeral 141 denotes a light-emitting region of a top emission type light-emitting element, reference numeral 142 denotes a light-emitting region of a bottom emission type light-emitting element. Hereinafter, a structure of a light-emitting element is described in detail.

In this embodiment mode, the top emission type light-emitting element includes the first electrode 110*a*, the light-emitting substance containing layer 112, and the second electrode 113, and the bottom emission type light-emitting element includes the first electrode 110*b*, the light-emitting substance containing layer 112, and the second electrode 113. The TFTs 107*a* and 107*b* (p-channel TFTs) are formed over the insulating layer 102 that is formed on the substrate 101. Each of the TFTs comprises a semiconductor region having channel forming regions 103*a* and 103*b*, low concentration impurity regions 104*a* and 104*b*, and high concentration impurity regions 105*a* and 105*b* (a source region or a drain region), a gate insulating film (not shown) provided between the semiconductor region and a gate electrode, gate electrodes 106*a* and 106*b*, drain electrodes (or source electrodes) 108*a* and 108*b*.

Although not shown, wirings such as a power supply line (a wiring for supplying constant voltage or constant current) and a source wiring are simultaneously formed in the same step as the drain electrodes 108*a* and 108*b*. Although an example of forming the first electrode and the drain electrode separately is shown, the both may be formed from the same film. In this case, the drain electrode is formed in a light-emitting region of the top emission type light-emitting element. The drain electrode in this case may be a laminate in which a titanium film, a titanium nitride film, a film containing mainly aluminum, and a titanium nitride are laminated sequentially.

The insulating layer 109 comprising an organic material or an inorganic material is formed between the semiconductor region and the drain electrodes (or source electrodes) 108*a* and 108*b*. Additionally, although not illustrated here, one or a plurality of TFTs (n-channel TFTs or p-channel TFTs) are provided for one pixel. Here, the TFT having one channel forming region 103*a* and 103*b* is shown, but there is no limitation of the number of channels and a TFT may have a plurality of channels. Further, although the TFT having low concentration impurity regions 104*a* and 104*b* is shown here, the TFT is not limited thereto and may have channel forming regions 103*a* and 103*b* and high concentration impurity regions 105*a* and 105*b* (source region and drain region).

The semiconductor region can be formed by using an amorphous semiconductor region or a crystalline semiconductor region. In addition, as the material of the semiconductor region, an element or an alloy of semiconductor elements (such as silicon and germanium), an organic semiconductor material or the like can be used. The organic semiconductor material is the organic compound which shows semiconductor electrical properties of the specific resistance of about from $10^{-2}$ Ωcm to $10^{16}$ Ωcm, and the structure is preferably is a high-molecular-weight material of the π (pi) electron conjugate system in which the skeleton is made up of conjugated double bond. Concretely, a soluble high-molecular-weight material such as polythiophene, poly(3-alkylthiophene) or polythiophene derivative is preferable.

For the substrate 101 and an opposite substrate 117, a non-alkaline glass substrate such as alumino borosilicate glass, barium borosilicate glass, aluminosilicate glass, or a plastic substrate such as PET (polyethylene terephthalate), PEN (polyethylenenaphthalate), PES (a polyeter sulfide), polypropylene, polypropylene sulfide, polycarbonate, polyetherimide, polyphenylene sulfide, polyphenylene oxide, poly sulfone or polyphthalamide can be used.

In addition, the first electrodes 110*a* and 110*b* are anodes (or cathodes) of the light-emitting element and, the first electrode 110*a* comprises a conductive film having light shielding effect, and the first electrode 110*b* is formed from a light-transparent conductive film. In this embodiment mode, the first electrode 110*a* comprising a conductive film having light shielding effect covers the light-emitting region 141 of the top emission type light-emitting element, and the first electrode 110*b* comprising a light-transparent conductive film covers the light-emitting region 142 of the bottom emission type light-emitting element. In other words, the first electrode 110*a* comprising a conductive film having light shielding effect covers the TFT 107*a* of the top emission type light-emitting element and a portion except a part of the drain electrode 108*b* of the TFT 107*b* of the bottom emission type light-emitting element. The area of the light-emitting region 142 of the bottom emission type light-emitting element can be increased by this structure. Also, the first electrode 110*a* comprising a conductive film having light shielding effect may have a two-layer structure with a light-transparent conductive film or a laminate structure thereof.

Details of the material of the conductive film having light shielding effect are explained in Embodiment Mode 4.

The first electrodes 110*a* and 110*b* are formed over the insulating layer 111 covering the insulating layer 109. The first electrodes 110*a* and 110*b* are connected to the TFTs 107*a* and 107*b* through the insulating layer 111. For the insulating layer 111, an inorganic material (such as silicon oxide, silicon nitride or silicon oxynitride), a photosensitive or a non-photosensitive organic material (such as polyimide, acryl, polyamide, polyimidamide, resist or benzocyclobutene) or a laminate thereof can be used.

The light-emitting substance containing layer 112 is formed by vapor deposition method or an application method such as spin coating or ink-jetting. When a light-emitting material is a low-molecular-weight material, a vapor deposition method is mainly employed. When a light-emitting material is a middle-molecular-weight material or a high-molecular-weight material, an application method is used mainly. Here, the light-emitting substance containing layer 112 is formed in a vapor deposition system to obtain the uniform film thickness. Note that a vacuum heat (from 100° C. to 250° C.) is preferably performed to deaerate just before forming a light-emitting substance containing layer 112 for the purpose of enhancing the reliability.

The second electrode 113 is formed from a conductive film and is a cathode (or anode) of the light-emitting element. Details of the material of a cathode (or anode) of the light-emitting element is explained in Embodiment Mode 4. Here, an Ag film or a MgAg alloy film of from 1 nm to 10 nm thick is used, since a two-surface emission type in which light passes through the second electrode and is emitted is employed. In addition, a light-transparent layer (from 1 nm to 5 nm in thickness) comprising $CaF_2$, $MgF_2$, or $BaF_2$ may be formed as a buffer layer of the cathode before forming the Ag film of from 1 nm to 10 nm thick.

A light-transparent conductive film (ITO, indium oxide-tin oxide alloy), indium oxide-zinc oxide alloy ($In_2O_3$—ZnO), zinc oxide (ZnO) or the like may be formed with a thickness of from 50 nm to 200 nm over a metal thin film of from 1 nm to 10 nm in thickness so that the cathode can have lower resistance. Further, the cathode may be selectively formed by a vapor deposition method (a resistance heating) using a vapor deposition mask.

The light shielding film 114 is provided so that the light emitted from the bottom emission type light-emitting element does not leak upwardly. The light shielding film may be formed from Al, Ti, Mo or other metals, or a resin material that is not light-transparent and that includes a pigment. By using a conductive film as the light shielding film, the light shielding film also functions as an auxiliary electrode, thereby reducing the resistance of the cathode.

The transparent protective layer 115 is formed by sputtering or a vapor deposition method, and serves as a sealing film for preventing penetration of moisture as well as protecting the second electrode 113 and the light shielding layer 114 that comprise metal thin films, respectively. A silicon nitride film, a silicon oxide film, a silicon oxynitride film (SiNO film (composition ratio N>O) or SiON film (composition ratio N<O)), or a thin film mainly containing carbon (e.g. DLC film, CN film) obtained by a sputtering method or by CVD can be used for the transparent protective layer 115.

The thus obtained transparent protective layer 115 is suitable as a sealing film of a light-emitting element that employs an organic compound containing layer as a light-emitting substance containing layer.

The substrate 101 is bonded to the opposite substrate 117 by the sealing agent 116. The sealing agent includes a gap material for securing the space between the substrates and is arranged to surround a pixel portion.

Figure 4:
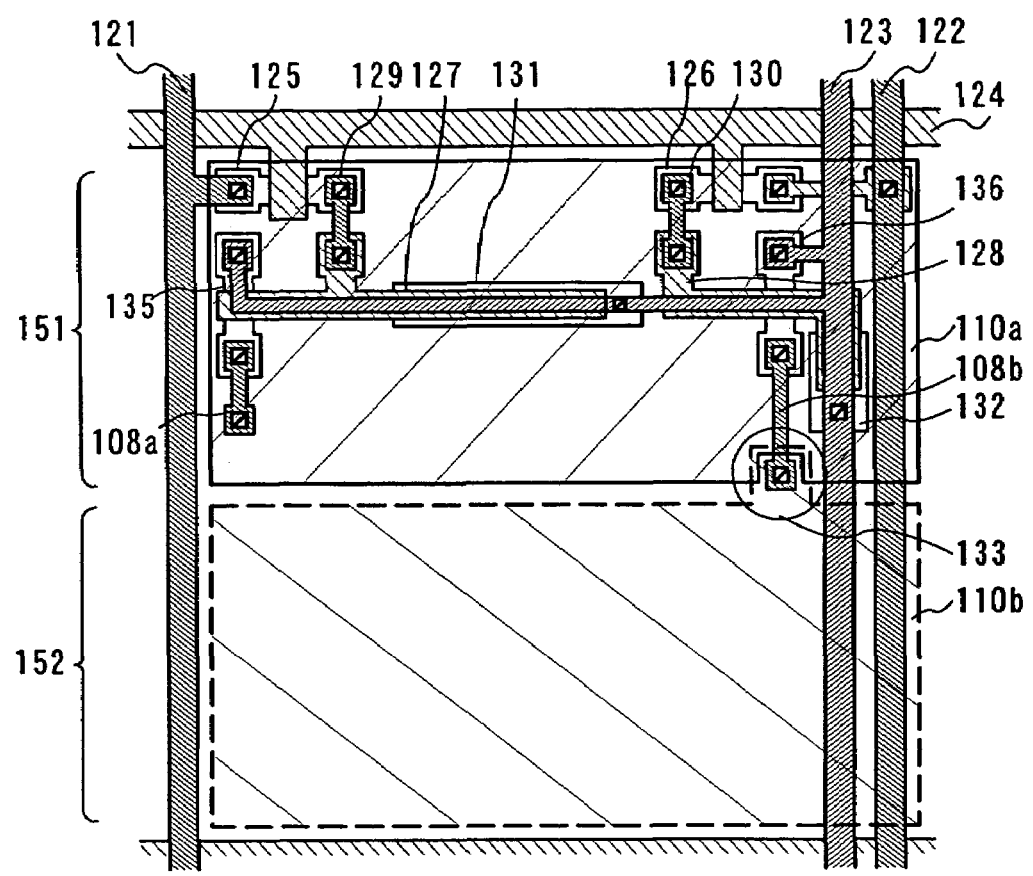
FIG. 4 is a top view of a light-emitting device according to the present invention.

Next, a top view of two adjacent pixels (a top emission type light-emitting element and a bottom emission type light-emitting element) shown in this embodiment mode is shown in FIG. 4. FIG. 4 is a top view of the state after the first electrodes 110a and 110b are formed (in other words, the state before forming a light-emitting substance containing layer 112) in FIG. 2. The same elements in FIG. 4 as those in FIG. 2 are shown by using the same reference numerals and the description thereof is omitted.

As shown in FIG. 4, two adjacent pixels of this embodiment mode has a first source signal line 121, a second source signal line 122, a power supply line (a wiring for supplying constant voltage or constant current) 123, and a gate signal line 124. The first source signal line 121 is a source signal line of a top emission type light-emitting element 151, and the second source signal line 122 is a source signal line of a bottom emission type light-emitting element 152. Further, the power supply line (a wiring for supplying constant voltage or constant current) 123 and the gate signal line 124 are provided for respective light-emitting elements in common, but may be provided every light-emitting element.

A switching TFT and a driving TFT are provided for the top emission type light-emitting element and semiconductor regions 125 and 135 are formed in the both TFTs, respectively. In addition, a switching TFT and a driving TFT are provided for the bottom emission type light-emitting element as well, and semiconductor regions 126 and 136 are formed in the both TFTs, respectively. In the source regions of the switching TFTs, respective source signal lines 121 and 122 are connected electrically. In addition, a gate signal line 124 covers channel forming regions of the semiconductor regions 125 and 126. Further, in the drain regions of the switching TFTs, drain electrodes 129 and 130 are connected thereto and connected to gate wirings 127 and 128 of the driving TFTs, respectively. The gate wirings 127 and 128 cover channel formation regions in the semiconductor regions 135 and 136 of the driving TFTs, respectively. The power supply line (wirings for supplying constant voltage or constant current) 123 is connected to each of source regions of the driving TFTs, and the drain regions are connected to the first electrodes 110a and 110b through the drain electrodes 108a and 108b.

Semiconductor regions 131 and 132 form a capacitor element and are connected to the power supply line 123 electrically. A first capacitor element comprises the first semiconductor region 131, a first insulating layer, the first gate wiring 127, a second insulating layer, and the power supply line 123. Also, a second capacitor element comprise the second semiconductor region 132, the first insulating layer, the second gate wiring 128, the second insulating layer, and the power supply line 123. Note that the capacitor elements are formed between the gate wirings and the source regions of driving TFTs, respectively.

After that, as shown in FIG. 2, the light-emitting substance containing layer 112 and a second electrode 113 are formed over the first electrodes 110a and 110b and a light shielding film 114 is formed over the second electrode 113 of the bottom emission type light-emitting element, and thus, an image can be displayed on both front and back sides (in other words, a top face and a bottom face).

As shown in FIG. 4, the first electrode 110a of the top emission type light-emitting element 151 covers a light-emitting region of the top emission type light-emitting element 151. In this region, the switching TFT and the driving TFT of the bottom emission type light-emitting element 152 are formed and an area except a connecting portion 133 of the first electrode of the bottom emission type light-emitting element 152 is covered by the first electrode 110a, and thus, the aperture ratio of the bottom emission type light-emitting element 152 improves. Also, because the source signal lines 121 and 122 are provided for both light-emitting elements, different images can be displayed in each of the light-emitting elements.

Embodiment Mode 3

Figure 3:
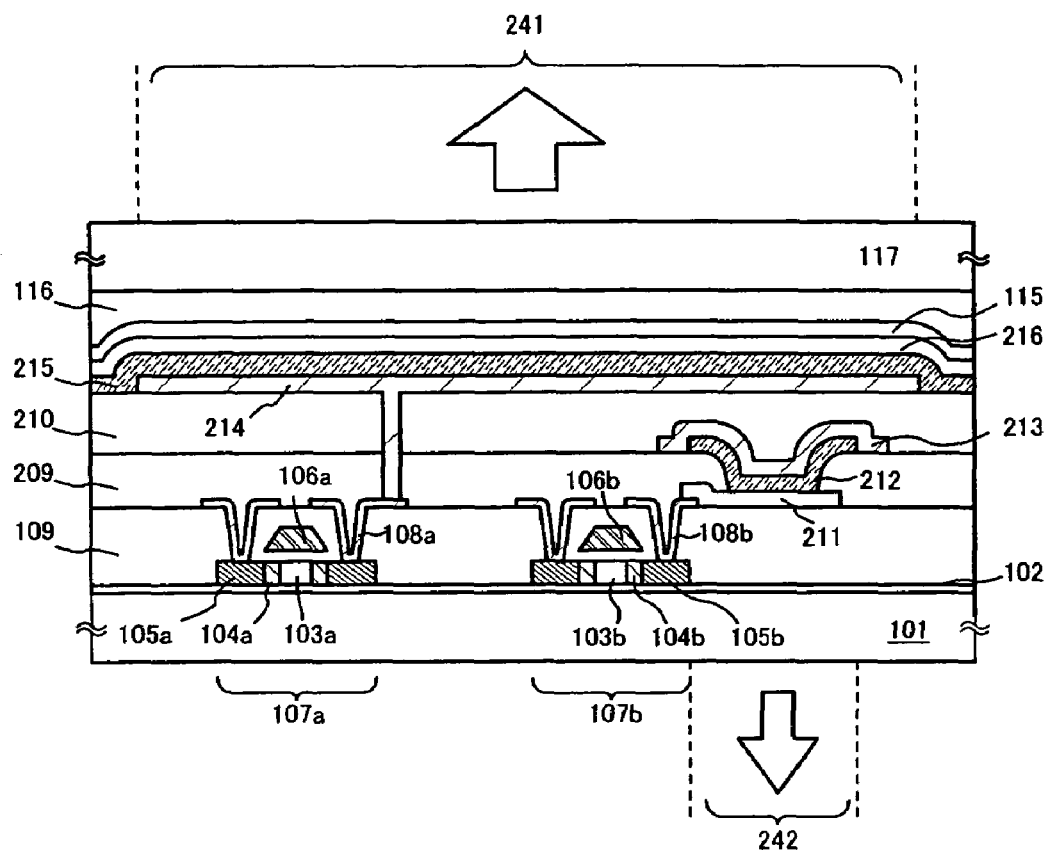
FIG. 3 is a cross-sectional view of a light-emitting device according to the present invention.

In this embodiment mode, a display device which can display an image in both front and back displays with a structure different from that in embodiment mode 2, is described with reference to FIG. 3. Note that this embodiment mode is equivalent to the structure of FIG. 1E described in Embodiment Mode 1. Note that as for the same elements as those in FIG. 2, detailed description is omitted, since the same reference numerals are used In this embodiment mode, a top emission type light-emitting element comprises a first electrode 214, a second light-emitting substance containing layer 215 and a second electrode 216, and a bottom emission type light-emitting element comprises a first electrode 211, a first light-emitting substance containing layer 212 and a second electrode 213.

TFT 107a and 107b are formed over a substrate 101 as in Embodiment Mode 2, and the first electrode, namely an anode 211 (or a cathode) of the bottom emission type light-emitting element is formed over a second insulating layer 109 and drain electrodes (or source electrodes) 108a and 108b. The first electrode 211 is formed from a light-transparent conductive film like the first electrode 110b of Embodiment Mode 2.

Over an edge portion of the first electrode 211, the second insulating layer 109 and the drain electrodes (or source electrodes) 108a and 108b, a third insulator 209 (as referred to as a bank, a partition, a barrier, a mound etc.) is formed to cover them.

For an insulating layer 209, an inorganic material (such as silicon oxide, silicon nitride or silicon oxynitride), a photosensitive or a non-photosensitive organic material (such as polyimide, acryl, polyamide, polyimidamide, resist or benzocyclobutene) or a laminate thereof can be used. Also, only a top edge portion of the insulating layer 209 may have a curved surface having a curvature radius by using a positive type photosensitive acryl as an organic resin material. Further, both a negative type resin that is insoluble in etchant by light and a positive type resin that is soluble in etchant by light can be used as the third insulating layer 209.

The first light-emitting substance containing layer 212 is formed in a light-emitting region 242 of the bottom emission type light-emitting element by a vapor deposition method or an application method such as spin coating or ink-jetting. Next, the second electrode 213 of the bottom emission type light-emitting element is formed.

Next, a fourth insulating layer 210 covering the third insulating layer 209 and the second electrode 213 is formed. After that, contact holes are formed in the third insulating layer 209 and the fourth insulating layer 210, and the first electrode 214 of the top emission type light-emitting element to connect to the drain electrode 108a of the TFT 107a is formed. After that, the second light-emitting substance containing layer 215 is formed over the first electrode 214 of the top emission type light-emitting element, and the second electrode 216 is formed over the fourth insulating layer 210 and the second light-emitting substance containing layer 215. The second electrode 216 is formed from the same material as the second electrode 113 of Embodiment Mode 2. A region where the first electrode 214, the second light-emitting substance containing layer 215 and the second electrode 216 are overlapped corresponds to a light-emitting region 241 of the top emission type light-emitting element.

After that, a transparent protective layer 115 is formed over the fourth insulating layer 210 and the second electrode 216 as in Embodiment Mode 2. After that, the substrate 101 is bonded to an opposite substrate 117 with a sealing agent 116.

Note that, in this embodiment mode, the second electrodes 213 and 216 are separated from each other, but may be connected to each other outside the light-emitting region.

A light-emitting device having the above-mentioned light-emitting element can display the same or different images on the both of front and back displays, simultaneously. In addition, since the TFT of the bottom emission type light-emitting element and the bottom emission type light-emitting element are below the first electrode (an electrode having light shielding effect) of the top emission type light-emitting element, the aperture ratio of the bottom emission type light-emitting element is enhanced remarkably.

Note that the first electrode 214 of the top emission type light-emitting element may be formed at the same time as formation of the second electrode 213 of the bottom emission type light-emitting element. In this case, the top emission type light-emitting element does not cover the bottom emission type light-emitting element, however, since two kinds of electrodes can be formed without performing an extra step, the many kinds of materials are not required and the cost can be reduced.

Note that other light-emitting devices shown in FIGS. 1A to 1F are also formed as in Embodiment Mode 2 or Embodiment Mode 3.

Embodiment Mode 4

In this embodiment mode, a structure of a light-emitting element which can be applied in Embodiment Modes 1 to 3 is described with reference to FIGS. 5A and 5B.

The light-emitting element comprises a pair of an anode and a cathode, and a light-emitting substance containing layer sandwiched with the anode and the cathode. Hereinafter, an electrode formed on a substrate side is referred to as a first electrode, and an electrode formed on the opposite side of the substrate is referred to as a second electrode.

The light-emitting substance containing layer includes at least a light-emitting layer, and is formed from any one of a hole injecting layer, a hole transporting layer, a shielding layer, an electron transporting layer and an electron injecting layer that have different functions for carriers, or by combining plural layers thereof and laminating them.

Figure 5A:
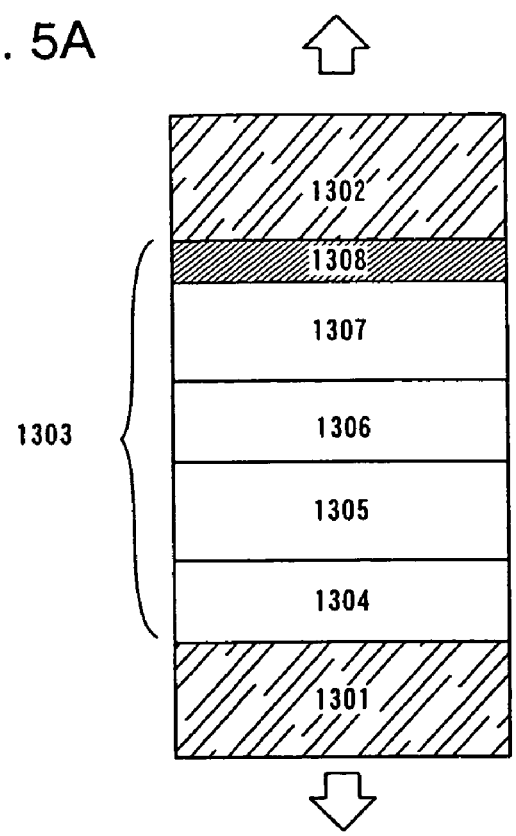
FIGS. 5A and 5B show light-emitting elements according to the present invention.
Figure 5B:
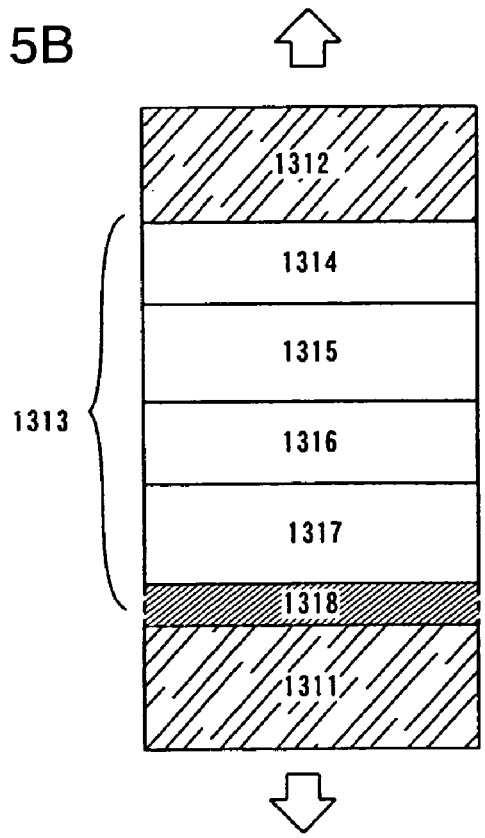

FIGS. 5A and 5B each show an example of a cross sectional structure of the light-emitting element.

In FIG. 5A, a hole injecting layer 1304, a hole transporting layer 1305, a light-emitting layer 1306, an electron transporting layer 1307 and an electron injecting layer 1308 are laminated over a first electrode (an anode) 1301 in a light-emitting substance containing layer 1303, and a second electrode (cathode) 1302 is provided to be in contact with the electron injecting layer 1308. This structure is, here, referred to as a sequence laminate type element.

Further, in FIG. 5B, an electron injecting layer 1318, an electron transporting layer 1317, a light-emitting layer 1316, and a hole transporting layer 1315, a hole injecting layer 1314 are laminated over a first electrode (a cathode) 1311 in a light-emitting substance containing layer 1313, and a second electrode (an anode) 1312 is provided to be in contact with the hole injecting layer 1314. This structure is, here, referred to as a reverse laminate type element.

In this embodiment mode, the first light-emitting element and the second light-emitting element may employ either the mode of FIG. 5A or that of FIG. 5B. Both the first light-emitting element and the second light-emitting element may employ the sequence laminate type element or the reverse laminate type element, or one light-emitting element may be the sequence laminate type element and the other light-emitting element may be the reverse laminate type element. The former layer structure is desirable for that case of the light-emitting element shown in FIG. 2, and the latter layer structure is desirable for that case of the light-emitting element shown in FIG. 3.

Note that this embodiment mode is not limited to this. Various kinds of light-emitting element structure, e.g., an anode/a hole injecting layer/a light-emitting layer/an electron transporting layer/a cathode, an anode/a hole injecting layer/a hole transporting layer/ a light-emitting layer/an electron transporting layer/an electron injecting layer/a cathode, an anode/a hole injecting layer/a hole transporting layer/a light-emitting layer/a hole shielding layer/an electron transporting layer/cathode, an anode/a hole injecting layer/a hole transporting layer/a light-emitting layer/a hole shielding layer/an electron transporting layer/an electron injecting layer/cathode and the like can be employed. Also, a stripe arrangement, a delta arrangement, a mosaic arrangement or the like can be cited as the arrangement of a light-emitting region, that is to say, the arrangement of a pixel electrode.

A material of a light-emitting device that can emit light in both front and back sides, that is, a substrate side and an opposite substrate side, is described hereinafter.

A conductive material having a large work function is desirably used for the material of the anode. In the case where light passes through the anode side, the anode may be formed from a transparent conductive material such as an indium oxide-tin oxide alloy (ITO), or indium oxide-zinc oxide alloy (IZO). Further, when the anode side has a light shielding effect, the anode may be formed from a laminated layer of a titanium nitride film and a film mainly containing aluminum, and a three-layer structure of a titanium nitride film, a film mainly containing aluminum, and a titanium nitride film, as well as a single layer of a film made of TiN, ZrN, Ti, W, Ni, Pt, Cr, Al, or the like. Alternatively, the anode may be formed by a method of laminating the above-described transparent conductive material over the above-described film having a light shielding effect.

A conductive material having a small work function is preferably used for the material of the cathode. Specifically, the cathode can be formed by using a rare-earth metal such as Yb or Er, as well as an alkali metal such as Li or Cs, and an alkaline-earth metal such as Mg, Ca, or Sr and an alloy including them. (Mg: Ag, Al: Li, or the like). In addition, when the electron injecting layer made of LiF, CsF, CaF$_2$, Li$_2$O or the like is employed, a conventional conductive thin film such as aluminum can be used. In the case where light passes through the cathode side, an alkali metal such as Li or Cs, and an ultra thin film including an alkaline-earth metal such as Mg, Ca, or Sr and a laminate structure with a transparent conductive film (such as ITO, IZO, or ZnO) may be used for the cathode. The electron injecting layer that is formed by co-evaporation of an alkali metal or an alkaline-earth metal and an electron transport material, and a transparent conductive film (such as ITO, IZO, ZnO) may be laminated thereover.

A low-molecular-weight, a high-molecular-weight, or a middle-molecular-weight of a known organic compound typified by oligomer or a dendrimer can be used as the material for forming the light-emitting substance containing layers 1303 and 1313. Alternatively, a light-emitting material (fluorescent material, singlet compound) that emits light (fluorescence) by singlet excitation or a light-emitting material (phosphorescent material, triplet compound) that emits light (phosphorescence) by triplet excitation can be used.

Concrete examples of the material for forming the light-emitting substance containing layers 1303 and 1313 are shown below.

A porphyrin system compound is effective as a hole injection material for forming the hole injecting layers 1304 and 1314, in the case of an organic compound, for example, phthalocyamine (hereinafter referred to as H$_2$-Pc), copper phthalocyamine (hereinafter referred to as Cu-Pc), or the like can be used. A material in which chemical doping is performed on a conductive high-molecular-weight compound can also be used, and polyethylene dioxythiophene (hereinafter referred to as PEDOT) doped with polystyrene sulfonate (hereinafter referred to as PSS), polyaniline, polyvinyl carbazole (hereinafter referred to as PVK), and the like can be given as examples. Further, an inorganic semiconductor thin film such as vanadium pentoxide, an ultra thin film of an inorganic insulator such as aluminum oxide is also effective.

As the hole transport material used for forming the hole transporting layers 1305 and 1315, an aromatic amine-based (that is, compound having a benzene ring-nitrogen bond) compound is preferred. As the material that is used widely, for example, N,N'-bis(3-methylphenyl)-N,N'-diphenyl-1,1'-biphenyl-4,4'-diamine (TPD); derivatives thereof such as 4,4'-bis[N-(1-naphthyl)-N-phenyl-amino]-biphenyl (α-NPD) and the like are cited. Also, star burst aromatic amine compounds such as 4,4',4"-tris(N,N-diphenyl-amino)-triphenylamine (TDATA) and 4,4',4"-tris [N-(3-methylphenyl)-N-phenyl-amino]-triphenylamine (MTDATA) can be used.

Specific examples of the light-emitting material used for forming the light-emitting layers 1306 and 1316 include metal complexes such as tris (8-quinolinolato)aluminum (hereinafter, referred to as Alq$_3$), tris(4-methyl-8-quinolinolato)aluminium (hereinafter, referred to as Almq$_3$), bis(10-hydroxybenzo[h]-quinolinate)beryllium (hereinafter, referred to as BeBq$_2$), and bis(2-methyl-8-quinolinolato)-(4-hydroxy-biphenylyl)-aluminum (hereinafter, referred to as BAlq), bis[2-(2-hydroxyphenyl)-benzooxazolate]zinc (hereinafter, referred to as Zn(BOX)$_2$) and bis[2-(2-hydroxyphenyl)-benzothiazolate]zinc (hereinafter, Zn(BTZ)$_2$). Also, various fluorescent dyes are effective for the material of the light-emitting layers. Triplet light-emitting materials may be also used and main examples thereof include complexes with platinum or iridium as the central metal. Known triplet light-emitting materials include tris(2-phenylpyridine)iridium (hereinafter, referred to as Ir(ppy)$_3$), 2,3,7,8,12,13,17,18-octaethyl-21H,23H-porphyrin-platinum (PtOEP) and the like.

Metal complexes are often used as the electron transport material for forming the electron transporting layers 1307 and 1317. Preferred examples of the metal complex include tris (8-quinolinolato)aluminum (Alq$_3$), tris(4-methyl-8-quinolinolato) aluminium (Almq$_3$), and bis(10-hydroxybenzo[h]-quinolinate)beryllium (BeBq$_2$), bis(2-methyl-8-quinolinolato)-(4-hydroxy-biphenylyl)-aluminum (BAlq), bis[2-(2-hydroxyphenyl)-benzooxazolate] zinc (Zn(BOX)$_2$) and bis[2-(2-hydroxyphenyl)-benzothiazolate] zinc (Zn (BTZ)$_2$). Other materials that are capable of transporting electrons in addition to the metal complexes are oxadiazole derivatives such as 2-(4-biphenylyl)-5-(4-tert-butylphenyl)-1,3,4-oxadiazole (PBD), and 1,3-bis[5-(p-tert-butylphenyl)-1,3,4-oxadiazole-2-yl]benzene (OXD-7), triazole derivatives such as 3-(4-tert-butylphenyl)-4-phenyl-5-(4-biphenylyl)-1,2,4-triazole (TAZ) and 3-(4-tert-butylphenyl)-4-(4-ethylphenyl)-5-(4-biphenylyl)-1,2,4-triazole (p-EtTAZ), imidazole derivatives such as 2,2',2"-(1,3,5-benzenetriyl)tris[1-phenyl-1H-benzimidazole (TPBI) and phenanthroline derivatives such as bathophenanthroline (BPhen) and bathocuproin (BCP).

As the electron injection material to be used for forming electron injecting layers 1308 and 1318, the above described electron transport materials can be used. Besides, a ultra thin film of an insulator, for example, an alkaline metal halogenated compound such as LiF or CsF, an alkaline earth halogenated compound such as CaF$_2$, or an alkaline metal oxide such as Li$_2$O is often used. In addition, an alkaline metal complexe such as lithium acetylacetonate (Li(acac)), 8-quinolinolato-lithium (Liq) can also be used effectively.

The light-emitting element shown in Embodiment Modes 1 to 3 can be formed by appropriately selecting the above described structure and material.

When the light-emitting device of this embodiment mode is a full color display, the material layers which each show red, green, and blue colors can be deposited as the light-emitting substance containing layers 1303 and 1313 using a vapor-deposition mask, respectively, Instead of this method, spin coating, or an ink-jetting method can be appropriately employed for the film formation selectively.

In addition, the light-emitting substance containing layer is a white light-emitting layer and a full color may be displayed by providing a color filter separately. Alternatively, the light-emitting substance containing layer is a blue light-emitting layer and a full color may be displayed by providing color conversion layers separately.

Embodiment Mode 5

Next a driving method of a light-emitting device of the present invention shown in Embodiment Modes 1 to 4 is described below.

In this embodiment mode, because it is difficult to distinguish between a source region and a drain region of a TFT depending on the structure or an operating condition, one electrode is referred to as a first electrode and the other is referred to as a second electrode. In addition, a first light-emitting element is a top emission type light-emitting element and a second light-emitting element is a bottom emission type light-emitting element.

Figure 6:
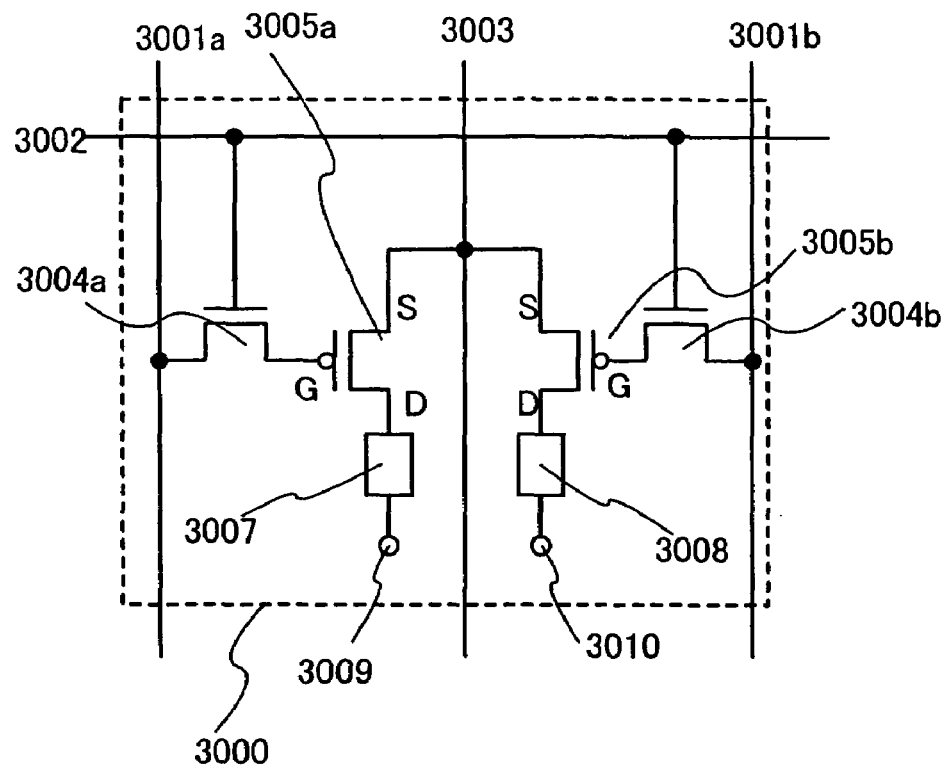
FIG. 6 shows a structure according to the present invention.

An example of this embodiment mode is shown in FIG. 6. This embodiment mode shows an example in which light emission or non-light emission of a first light-emitting element 3007 and a second light-emitting element 3008 is controlled by first and second driving TFTs 3005a and 3005b.

The region surrounded by a dotted line frame 3000 is a repetition unit of a light-emitting device, and a first source signal line 3001a, a second source signal line 3001b, a gate signal line 3002, a power supply line (a wiring for supplying constant voltage or constant current) 3003, a first switching TFT 3004a, a second switching TFT 3004b, the first driving TFT 3005a, the second driving TFT 3005b, the first light-emitting element 3007, the second light-emitting element 3008 are included therein. In each pixel, a region in which emitted light of the first light-emitting element 3007 can be obtained is a first region and a region in which emitted light of the second light-emitting element 3008 can be obtained is a second region. And the regions are included in the repetition unit one by one, respectively. Also, the first region is a top emission type and the second region is a bottom emission type.

A gate electrode of the first switching TFT 3004a is connected to the gate signal line 3002 electrically, the first electrode of the first switching TFT 3004a is connected to the first source signal line 3001a electrically, and the second electrode of the first switching TFT 3004a is connected to a gate electrode of the first driving TFT 3005a electrically. The first electrode of the first driving TFT 3005a is connected to the power supply line (a wiring for supplying constant voltage or constant current) 3003 electrically and the second electrode of the first driving TFT 3005a is connected to the first electrode of the first light-emitting element 3007 electrically. A gate electrode of the second switching TFT 3004b is connected to the gate signal line 3002 electrically, the first electrode of the second switching TFT 3004b is connected to the second source signal line 3001b electrically, and the second electrode of the second switching TFT 3004b is connected to a gate electrode of the second driving TFT 3005b electrically. The first electrode of the second driving TFT 3005b is connected to the power supply line (a wiring for supplying constant voltage or constant current) 3003 electrically and the second electrode of the second driving TFT 3005b is connected to the first electrode of the second light-emitting element 3008 electrically. The second electrodes of the first light-emitting element 3007 and the second light-emitting element 3008 are electrically connected to opposite electrodes 3009 and 3010 that each have a potential difference from the power supply line (a wiring for supplying constant voltage or constant current). Note that the opposite electrodes 3009 and 3010 may be a common electrode.

A video signal which is output into the first source signal line 3001a is input to a gate electrode of the first driving TFT 3005a at the timing when the first switching TFT 3004a turns ON, and current is supplied to the first and the second light-emitting elements 3007 and 3008 to emit light depending on the video signal. Similarly, the video signal output into the second source signal line 3001b is input to a gate electrode of the second driving TFT 3005b at the timing when the second switching TFT 3004b turns ON, and current is supplied to the first and the second light-emitting elements 3007 and 3008 to emit light depending on the video signal. As described above, the first region and the second region can allow light to be emitted from the both front and back sides of the substrate.

In FIG. 6, each light-emitting element 3007 and 3008 shares a gate signal line 3002, and the power supply line (a wiring for supplying constant voltage or constant current) 3003, but is not limited to this structure, the light-emitting elements may have a gate signal line and a power supply line, respectively. In addition, the example in which the driving TFTs for controlling light emission and non-light emission of each light-emitting element are provided in a pixel is shown, but is not limited to this structure and the driving TFTs may be provided outside the pixel (in the peripheral portion). Further, an external IC chip or the like may be used.

Figure 7:
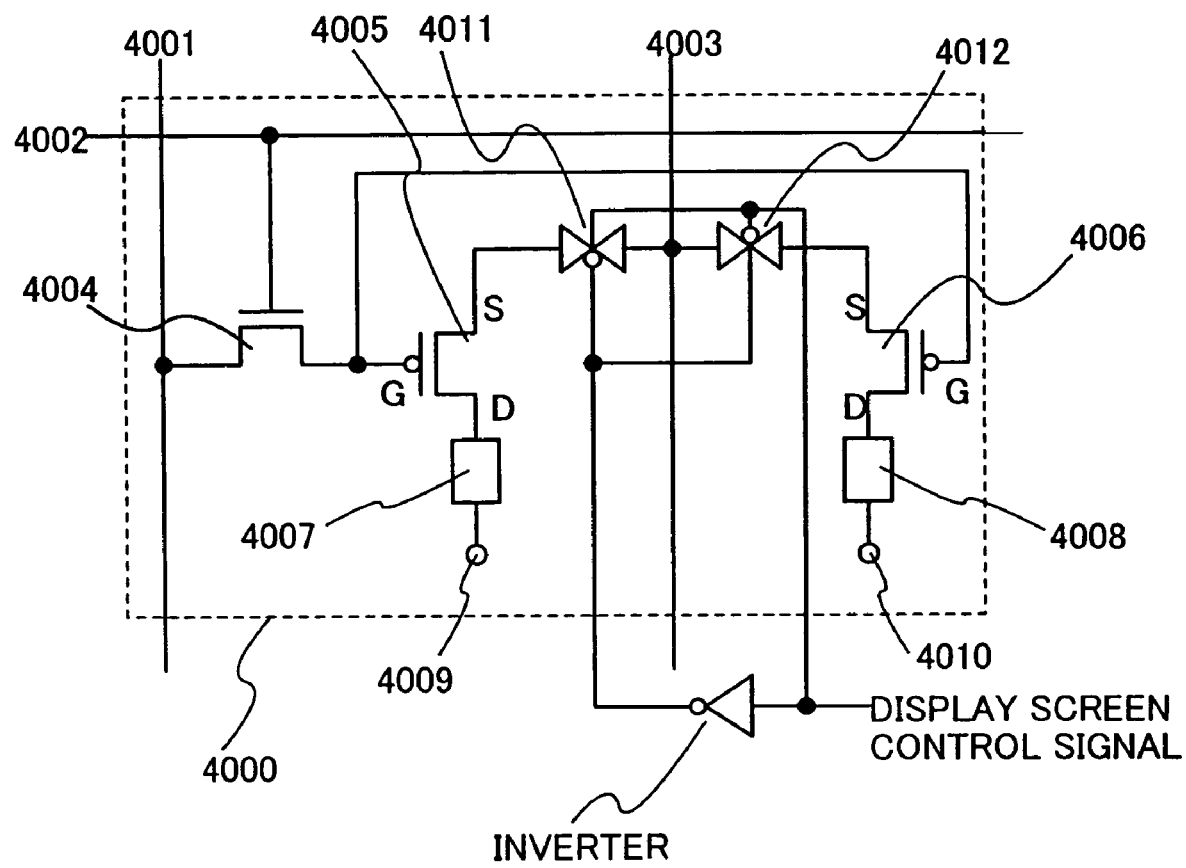
FIG. 7 shows a structure according to the present invention.

A structure that is different from that of FIG. 6 is shown with reference to FIG. 7. FIG. 7 shows a structure in which the switch for making respective light-emitting elements ON or OFF exclusively is provided. In FIG. 7, the region surrounded by a dotted line frame 4000 is a repetition unit of a light-emitting device, and a source signal line 4001, a gate signal line 4002, a power supply line (a wiring for supplying constant voltage or constant current) 4003, a switching TFT 4004, a first driving TFT 4005, a second driving TFT 4006, a first light-emitting element 4007, and a second light-emitting element 4008 are included therein. In each pixel, a region in which emitted light of the first light-emitting element 4007 can be obtained is a first region and a region in which emitted light of the second light-emitting element 4008 can be obtained is a second region. And the regions are included in the repetition unit one by one, respectively.

A gate electrode of the switching TFT 4004 is connected to the gate signal line 4002 electrically, the first electrode of the switching TFT 4004 is connected to the source signal line 4001 electrically, and the second electrode of the switching TFT 4004 is connected to gate electrodes of the first and the second driving TFTs 4005 and 4006 electrically. The first electrode of the first driving TFT 4005 is connected to the power supply line (a wiring for supplying constant voltage or constant current) 4003 electrically and the second electrode of the first driving TFT 4005 is connected to the first electrode of the first light-emitting element 4007 electrically. The first electrode of the second driving TFT 4006 is connected to the power supply line (a wiring for supplying constant voltage or constant current) 4003 electrically and the second electrode of the second driving TFT 4006 is connected to the first electrode of the second light-emitting element 4008 electrically. The second electrodes of the first light-emitting element 4007 and the second light-emitting element 4008 are electrically connected to opposite electrodes 4009 and 4010 that each have a potential difference from the power supply line (a wiring for supplying constant voltage or constant current) 4003.

Analog switches 4011 and 4012 that each operate exclusively are provided between the power supply line (a wiring for supplying constant voltage or constant current) 4003 and the first electrodes of the first and the second driving TFTs 4005 and 4006, and by controlling ON and OFF with a display screen control signal, the analog switch 4011 turns ON in a certain period, when current is supplied to the first light-emitting element 4007, emitted light can be obtained in the first region. On the other hand, the analog switch 4012 that operates exclusively from the analog switch 4011 is OFF at this time and thus, a current supplying path to the second light-emitting element 4008 is shut off. Therefore, the second region does not emit light. Conversely, at the period when the analog switch 4012 turns ON, current is supplied to the second light-emitting element 4008, and an image is displayed in the second region, the analog switch 4011 is OFF and a current supplying path to the first light-emitting element 4007 is shut off. Thus, the first region does not emit light. Accordingly, the first and the second regions emit light alternately, and different light can be emitted in each region, when a video signal to be displayed in each region is inputted to the source signal line 4001 alternately. As a result, different images can be displayed in the front and back sides.

Here, an analog switch is used as the switch for making each light-emitting element ON or OFF exclusively, however, is not limited to this, and a TFT, a mechanical switch or the like can be used. In addition, the example in which a switch for making each light-emitting element ON or OFF exclusively is provided in a pixel is shown, but is not limited to this structure and the driving TFTs may be provided outside the pixel (in the peripheral portion). Further, an external IC chip or the like may be used.

Figure 8:
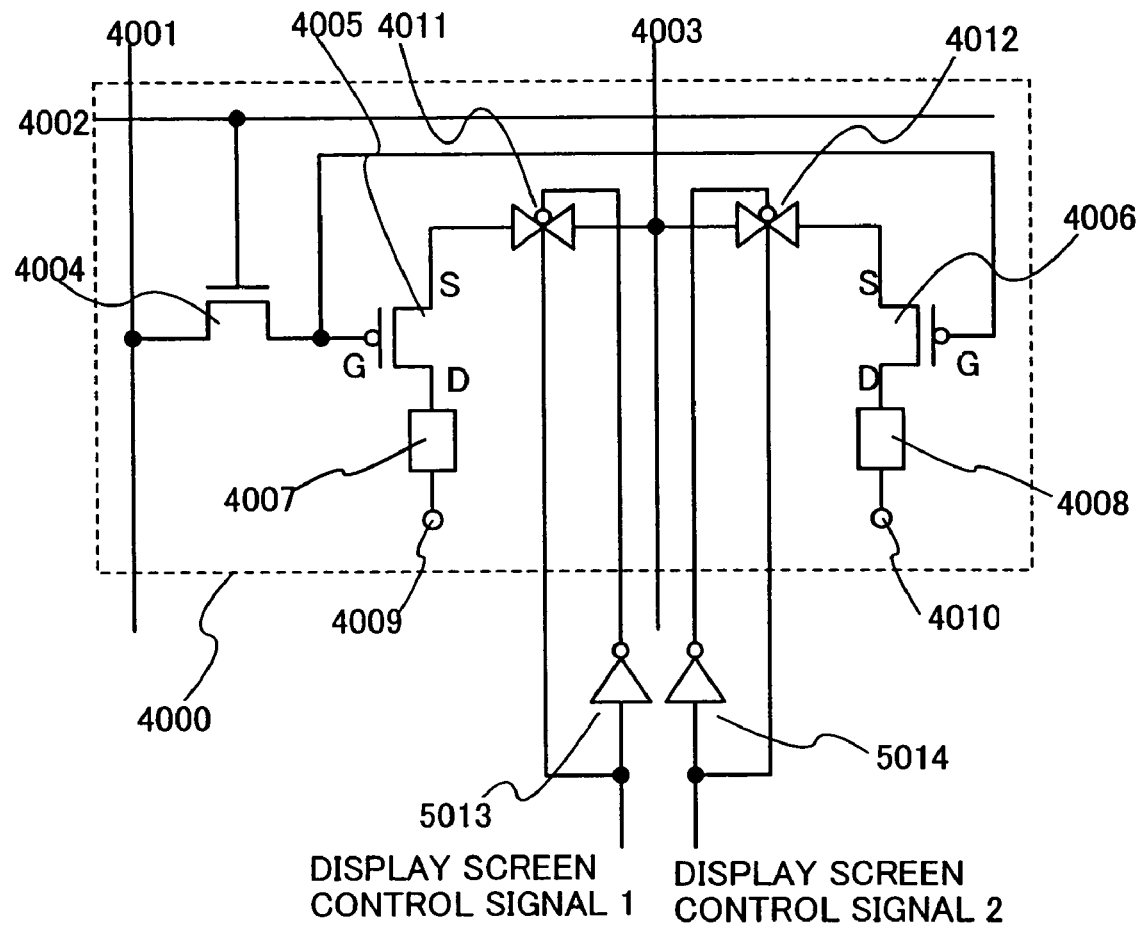
FIG. 8 shows a structure according to the present invention.

In addition, instead of operating the analog switches 4011 and 4012 exclusively, as shown in FIG. 8, independent control using a first inverter 5013, a second inverter 5014, the first analog switch 4011, the second analog switch 4012, a display screen control signal 1, and a display screen control signal 2 may be performed. Both the first region and the second region can change displaying and non-displaying optionally in accordance with this structure.

By using the structures shown in FIGS. 7 and 8, for example, there is a method by which a display of the first region is performed in an odd number frame and a display of the second region is performed in an even number frame in one frame period, as a method for displaying different images in the first and the second regions, respectively. At the time, a display screen control signal is reversed every one frame period, and ON/OFF may be changed by the analog switches 4011 and 4012 in FIG. 7 and the analog switches 4011 and 4012 in FIG. 8 every one frame.

In addition, a display screen control signal in structure shown in FIG. 7 is output by a user's operation, and switching of a display screen may be performed, and a switching operation may be performed automatically depending on a state of use (for example, the state in which a terminal is folded or open).

By the above-mentioned driving methods, different images can be displayed in the first region and the second region, in other words, in the front and back sides of a light-emitting device simultaneously. When a display device is watched from both sides, the same image can be watched simultaneously without watching a mirror image of one side from the other side. Also, completely different images can be watched from the both sides.

EMBODIMENTS

In this embodiment, an electronic device having a light-emitting device formed in Embodiment Modes 1 to 5 is described. The present invention may be applied to electronic devices such as a video camera, a digital camera, a laptop personal computer, a personal digital assistant (such as a mobile computer, a portable telephone, a portable game machine or an electronic book), an image reproduction device having a recording medium (specifically, a device having a display that can reproduce a recording medium such as a digital versatile disc and can display the image), a TV image receiver, an electric signboard, an electronic book and the like are cited. Hereinafter, a representative example thereof is shown.

Embodiment 1

An example of applying a light-emitting device of the present invention to a portable telephone as a representative of a personal digital assistant is shown in this embodiment.

Figure 9A:
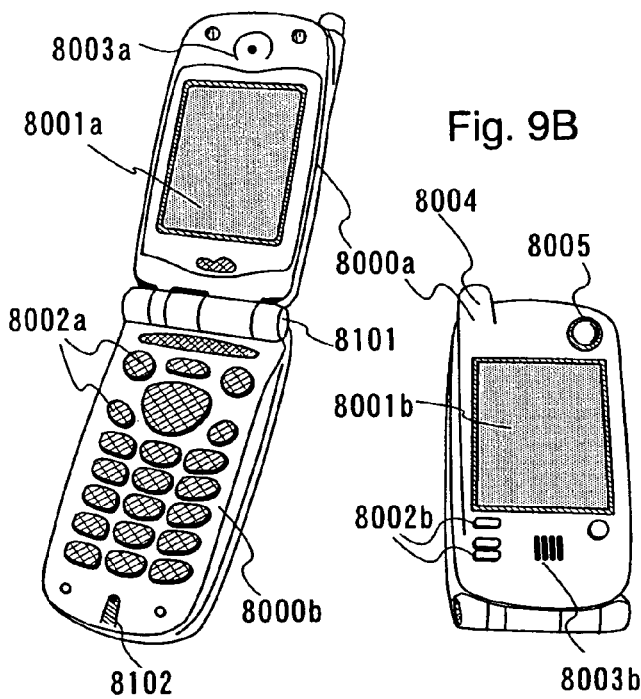
FIGS. 9A to 9D show an example of an electronic device according to the present invention.
Figure 9B:
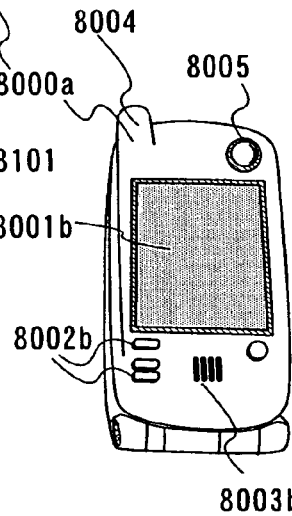

FIGS. 9A to 9D are overviews of a portable telephone of the present invention. FIG. 9A is a perspective view showing a state in which the portable telephone is open. FIG. 9B is a perspective view showing a state in which the portable telephone is closed and the perspective view is seen from a first casing side where a second display screen is provided.

In the portable telephone, two casings (a first casing 8000a and a second casing 8000b) are connected to each other by a hinge 8101 and can be rotated with the hinge 8101 as a center.

A first display screen 8001a, a second display screen 8001b, operation buttons 8002b, speakers 8003a and 8003b, an antenna 8004, a camera lens 8005 and the like are provided in the first casing 8000a.

On the other hand, the second casing 8000b has operation buttons 8002a, a microphone 8102 and the like.

When the portable telephone is open, the first display screen 8001a is employed as a main display screen. The screen operation is performed by using the operation buttons 8002a. When the portable telephone is closed, the second screen 8001b is employed as a main display screen. In this case, operation of display information is performed by the operation buttons 8002b which are formed in the first casing.

Figure 9C:
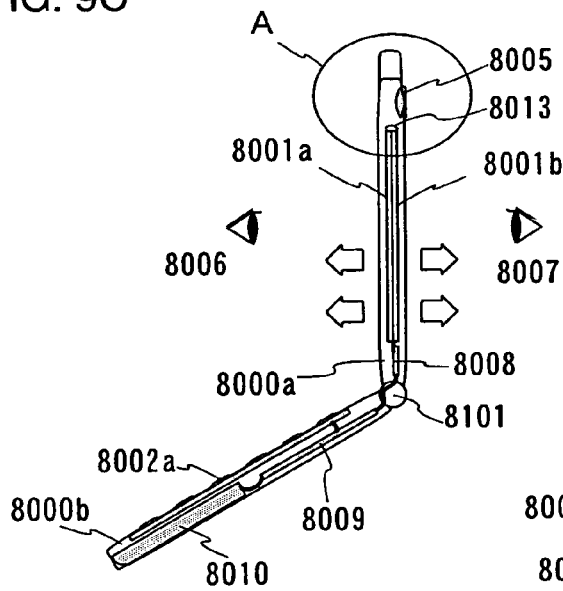

FIG. 9C is a cross-sectional view in which the portable telephone of FIG. 9A is seen from the side. A display controller 8008 connected to a display portion is provided inside the first casing 8000a, and display content is controlled. In the second casing 8000b, a battery 8010 and a main body driving module 8009 are formed, and the display portion, the display controller 8008, the main body driving module 8009 and the like are driven by using electric power generated in the battery 8010.

Figure 9D:
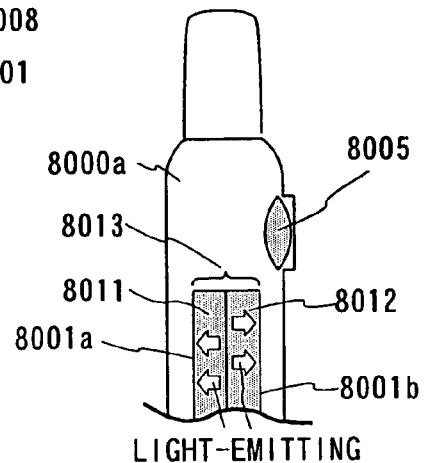

FIG. 9D is a view in which a region A of FIG. 9C is magnified. The first screen 8001a and the second screen 8001b each display an image by the emitted light from the display portion 8013 (including a light-emitting element formed between a substrate 8011 and an opposite substrate 8012).

A light-emitting device shown in Embodiment Modes 1 to 5 can be applied to the display portion 8013 in this embodiment.

When an image is displayed in the first screen 8001a and the second screen 8001b simultaneously, a monitor image can be seen on both photographer side 8006 and a person's side to be photographed 8007, and it is possible for the photographer to press the shutter button after the person to be photographed ensures whether intention of photographing such as angle is satisfied. Communication of a photographer and a person to be photographed becomes smooth in such photographing, thereby preventing failure of photographing.

Also, photographing while monitoring in the second display screen 8001b having a wide display region is possible in photographing in the state where the lens 8005 faces the person to be photographed.

Further, two display devices are conventionally required to perform a display in the first screen and the second screen. However, because it is possible to display in different display screens in one display device in this embodiment, the volume of the portable telephone can be reduced and miniaturization of devices is possible.

In relationship of space, the display portion having the second display screen incorporates only a display screen occupying a small display area conventionally. However, according to the present invention, the second display screen 8001b having the same display size as the first display screen 8001a can be provided, a mail, a Web page and the like can be seen without opening the portable telephone. Therefore, a troublesome of the operation can be reduced.

A light-emitting device of the present invention can be applied to a digital camera or a digital video camera, and can have the same effect as in the case of applying to the portable telephone.

Embodiment 2

Figure 10A:
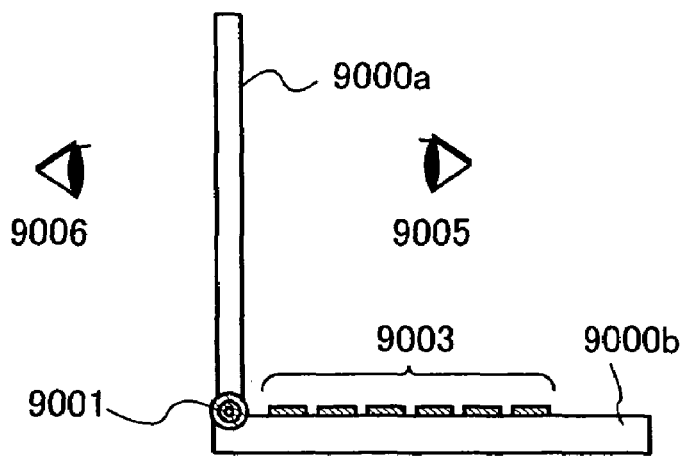
FIGS. 10A to 10C show an example of an electronic device according to the present invention.
Figure 10B:
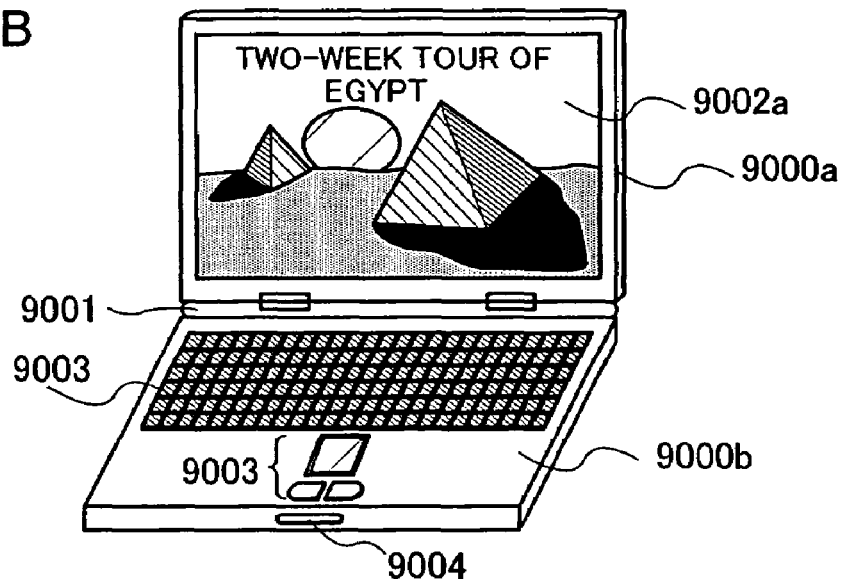
Figure 10C:
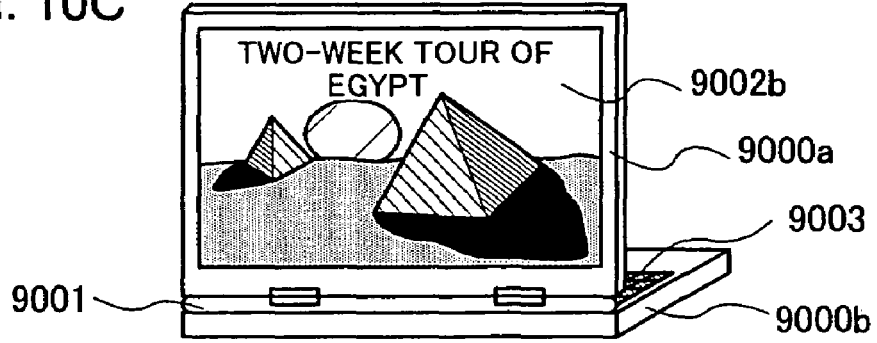

An example of applying a light-emitting device of the present invention to a laptop personal computer is shown in FIGS. 10A to 10C.

FIGS. 10A to 10C are each overviews of a laptop personal computer of the present invention. FIG. 10A is a side view of a state in which the laptop personal computer is open. FIG. 10B is a perspective view that is seen from a user's side 9005 (lecturer), in other words, a perspective view that is seen from the side of the first display screen that faces a keyboard when the two casings are closed. FIG. 10C a perspective view that is seen from an audience's side 9006, in other words, a perspective view that is seen from the display screen side (the second display screen side) 9002b that is opposed to the first display screen.

In the laptop personal computer, two casings (a first casing 9000a and a second casing 9000b) are connected by a hinge 9001, and can be rotated with the hinge 9001 as a center.

A display panel, operation buttons, a speaker, a display portion driving module (not shown) and the like are provided for the first casing 9000a, and the display panel includes the first display screen 9002a and the second display screen 9002b.

On the contrary, the second casing 9000b includes a keyboard 9003, a button for opening and shutting 9004, a module for driving a main body (not shown) and the like.

Two display screens can be provide in one display device in the laptop personal computer having a light-emitting device of the present invention, and therefore, the thickness of the display portion can be suppressed, the weight of the display screen is reduced and the device can be thinned. In other words, lightweight and miniaturization of the laptop personal computer can be obtained. Further, since audience 9006 can watch the same image as the operator of the laptop personal computer (lecturer) 9005 on the opposite side, the both can watch the image without sense of discomfort, when a lecture is given face-to-face.

A light-emitting device of the present invention can be applied to a TV image receiver, a DVD player with a display screen or the like and can have the same effect as in the case of applying it to the laptop personal computer. Completely different images can be displayed in the first display screen and the second display screen, and thus, plural images can be watched in one TV image receiver, one DVD player with a display screen or the like.

Embodiment 3

Figure 11:
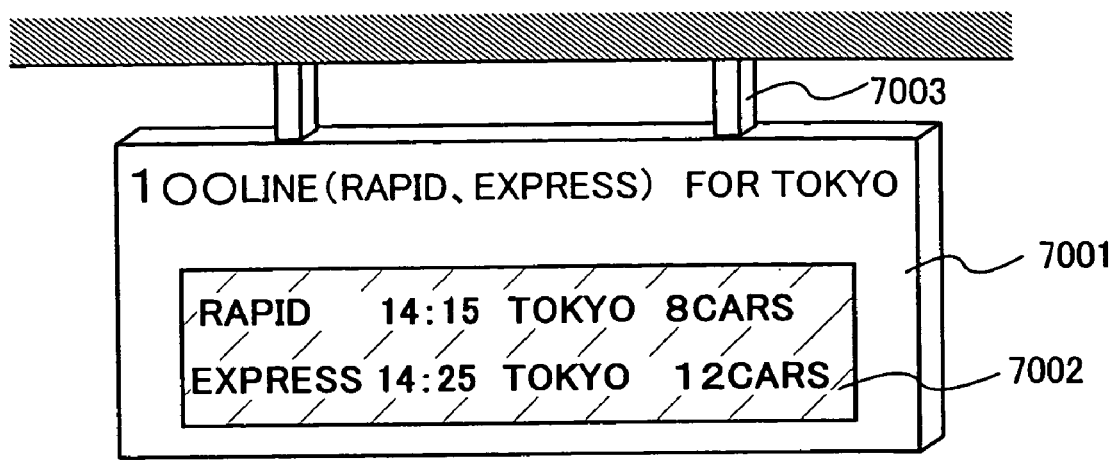
FIG. 11 shows an example of an electronic device according to the present invention.

An example of applying a display device of the present invention to an electric signboard is shown in FIG. 11.

FIG. 11 is an electric signboard for displaying a timetable of trains. The electric signboard includes a casing 7001, a display portion 7002, and a driving device for driving the display portion (not shown). The electric signboard is fixed to a ceiling, a wall, a pillar or the like with a supporting member 7003.

The light-emitting device of the present invention can be applied to the display portion, and thus, train information such as the type of trains, departure time, destinations, the number of cars can be displayed in the front and back sides, thereby reducing the weight of the electric signboard. Further, since different information can be displayed in each side, and therefore, the number of the electric signboards and the cost can be reduced.

The present invention can be applied to a electric guide plate as well as an electric signboard. In this case, the same effect as in the case of applying it to the electric signboard can be obtained.

According to the present invention, it is possible to independently display an image of both front and back sides, in a light-emitting device that can display in the both sides. Further, the present invention provides a light-emitting device in which the aperture ratio of both or either of front and back displays increases.

Since an electronic device using a light-emitting device of the present invention can independently display an image in the front and back sides, the same image can be seen in the both display screens at the same time without sense of discomfort. Further, since it is also possible to see different images in the both sides, plural persons can collect many pieces of information at the same time with a smaller space and reduced cost. Lightweight, and thinning of electronic devices can be obtained, and the operation property is enhanced and further, high added-value is realized.

This application is based on Japanese Patent Application serial no. 2003-139610 filed in Japan Patent Office on 16, May, 2003, the contents of which are hereby incorporated by reference.

Although the present invention has been fully described by way of Embodiment Modes and Embodiments with reference to the accompanying drawings, it is to be understood that various changes and modifications will be apparent to those skilled in the art. Such changes and modifications should be constructed as being included in the scope of the attached claims.

What is claimed is:

1. A light-emitting device comprising:
    a pixel portion in which a first light-emitting element and a second light-emitting element are adjacent to each other and formed over a substrate; and
    a first semiconductor element connected to the first light-emitting element and a second semiconductor element connected to the second light-emitting element, the first and second semiconductor elements formed over the substrate,
    wherein the first light-emitting element emits light in a direction of a first side of the substrate and the second light-emitting element emits light in a direction of a second side that is opposite to the first side of the substrate,
    wherein light-emission of the first light-emitting element in the direction of the second side is shielded and light-emission of the second light-emitting element in the direction of the first side is shielded, and
    wherein the first and second semiconductor elements are covered with one of the first light-emitting element and the second light-emitting element.

2. An electric device comprising the light-emitting device according to claim 1.

3. An electric device according to claim 2, wherein the electric device is selected from the group consisting of a video camera, a digital camera, a laptop personal computer, a personal digital assistant, a mobile computer, a portable telephone, a portable game machine, an electronic book, an image reproduction device having a recording, a TV image receiver, and an electric signboard.

4. A light-emitting device comprising:
a first light-emitting element and a second light-emitting element that are adjacent to each other formed over a substrate; and
a first semiconductor element connected to the first light-emitting element and a second semiconductor element connected to the second light-emitting element, the first and second semiconductor elements formed over the substrate,
wherein the first light-emitting element has a laminate structure in which a first light-transparent electrode, a light-emitting substance containing layer, and a second light-transparent electrode are sequentially formed from the substrate,
wherein the second light-emitting element has a laminate structure in which a third light-transparent electrode, the light-emitting substance containing layer, and the second light-transparent electrode are sequentially formed from the substrate,
wherein the first light-emitting element is formed over a first light shielding film and the first and second semiconductor elements, and
wherein the second light-emitting element is covered with a second light shielding film.

5. A device according to claim 4, wherein the first light-transparent electrode and the third light-transparent electrode comprise a same material.

6. An electric device comprising the light-emitting device according to claim 4.

7. An electric device according to claim 6, wherein the electric device is selected from the group consisting of a video camera, a digital camera, a laptop personal computer, a personal digital assistant, a mobile computer, a portable telephone, a portable game machine, an electronic book, an image reproduction device having a recording, a TV image receiver, and an electric signboard.

8. A light-emitting device comprising:
a pixel portion in which a first light-emitting element and a second light-emitting element are adjacent to each other and formed over a substrate; and
a first semiconductor element connected to the first light-emitting element and a second semiconductor element connected to the second light-emitting element, the first and second semiconductor elements formed over the substrate,
wherein the first light-emitting element emits light in a direction of a first side of the substrate and the second light-emitting element emits light in a direction of a second side that is opposite to the first side of the substrate,
wherein light-emission of the first light-emitting element in the direction of the second side is shielded and light-emission of the second light-emitting element in the direction of the first side is shielded,
wherein the first and second semiconductor elements are covered with one of the first light-emitting element and the second light-emitting element,
wherein the first light emitting element is formed over a first light shielding film, and
wherein the second light emitting element is covered with a second light shielding film.

9. An electric device comprising the light-emitting device according to claim 8.

10. An electric device according to claim 9, wherein the electric device is selected from the group consisting of a video camera, a digital camera, a laptop personal computer, a personal digital assistant, a mobile computer, a portable telephone, a portable game machine, an electronic book, an image reproduction device having a recording, a TV image receiver, and an electric signboard.

11. A light-emitting device comprising:
a pixel portion in which a first light-emitting element and a second light-emitting element are adjacent to each other and formed over a substrate; and
a first semiconductor element connected to the first light-emitting element and a second semiconductor element connected to the second light-emitting element, the first and second semiconductor elements formed over the substrate,
wherein the first light-emitting element emits light in a direction of a first side of the substrate and the second light-emitting element emits light in a direction of a second side that is opposite to the first side of the substrate,
wherein light-emission of the first light-emitting element in the direction of the second side is shielded and light-emission of the second light-emitting element in the direction of the first side is shielded,
wherein the first and second semiconductor elements are covered with one of the first light-emitting element and the second light-emitting element, and
wherein at least one of the first light-emitting element and the second light-emitting element has a light-transparent electrode.

12. An electric device comprising the light-emitting device according to claim 11.

13. An electric device according to claim 12, wherein the electric device is selected from the group consisting of a video camera, a digital camera, a laptop personal computer, a personal digital assistant, a mobile computer, a portable telephone, a portable game machine, an electronic book, an image reproduction device having a recording, a TV image receiver, and an electric signboard.

* * * * *